(12) United States Patent
Giovannotto

(10) Patent No.: US 8,026,765 B2
(45) Date of Patent: Sep. 27, 2011

(54) AUDIO FREQUENCY AMPLIFIER

(76) Inventor: Roberto Michele Giovannotto, Palo Alto, CA (US)

( * ) Notice: Subject to any disclaimer, the term of this patent is extended or adjusted under 35 U.S.C. 154(b) by 0 days.

(21) Appl. No.: 12/758,014

(22) Filed: Apr. 11, 2010

(65) Prior Publication Data

US 2010/0259328 A1 Oct. 14, 2010

Related U.S. Application Data

(60) Provisional application No. 61/168,611, filed on Apr. 12, 2009, provisional application No. 61/176,474, filed on May 7, 2009.

(51) Int. Cl.
*H03F 1/00* (2006.01)
(52) U.S. Cl. ..................... 330/195; 330/124 R
(58) Field of Classification Search .............. 330/124 R, 330/195, 295, 51, 296, 285
See application file for complete search history.

(56) References Cited

U.S. PATENT DOCUMENTS

| | | | |
|---|---|---|---|
| 4,633,191 A * | 12/1986 | Malka et al. .................. 330/275 |
| 5,168,438 A | 12/1992 | Smith | |
| 5,422,599 A | 6/1995 | Larsen | |
| 5,781,068 A * | 7/1998 | Takita .............................. 330/85 |
| 6,271,719 B1 * | 8/2001 | Sevastopoulos .............. 327/552 |
| 7,173,488 B2 | 2/2007 | Smith | |
| 7,348,845 B2 | 3/2008 | Giovannotto | |

* cited by examiner

*Primary Examiner* — Henry K Choe
(74) *Attorney, Agent, or Firm* — Thomas E. Lee, LLC

(57) ABSTRACT

An amplifier is operable in push-pull mode, single-ended mode, or a composite mode that is an intermediate between single-ended and Push-pull modes. Moreover, at least one output device may be configured to operate using a high performance AC servo loop that functions the output device as a current source. Still further, a control input driver stage is provided that is capable of supplying sufficient AC current to overcome Miller capacitance induced roll off within the intended frequency spectrum of triode vacuum tubes. Additionally, methods are provided to substantially null or selectively introduce DC magnetic bias within the output transformer core. Still further, a solid state power supply stage provides substantial AC hum reduction during single-ended operation and simultaneously provides output voltage load regulation attributes similar to traditional vacuum tube rectifier circuits.

19 Claims, 8 Drawing Sheets

AUDIO FREQUENCY AMPLIFIER

CROSS-REFERENCE TO RELATED APPLICATIONS

This application claims the benefit of U.S. Provisional Patent Application No. 61/168,611, entitled "AUDIO FREQUENCY AMPLIFIER EMPLOYING SYSTEMS AND METHODS TO INCREASE PERFORMANCE AND FIDELITY", filed Apr. 12, 2009, the disclosure of which is hereby incorporated by reference in its entirety. This application also claims the benefit of U.S. Provisional Patent Application No. 61/176,474, entitled "AUDIO FREQUENCY AMPLIFIER EMPLOYING MEANS FOR ALTERABLE HARMONIC FORMAT", filed May 7, 2009, the disclosure of which is also hereby incorporated by reference in its entirety.

BACKGROUND

Embodiments of the present invention relate in general to audio frequency amplifiers, and in particular, to audio amplifiers employing systems and methods to increase amplifier performance and fidelity. Embodiments of the present invention further relate to audio amplifiers having alterable harmonic format.

Ever since the invention of the vacuum tube audion by Lee De Forest in 1906, audio frequency amplifiers have been a mainstay of the consumer electronics marketplace. Moreover, audio frequency amplifiers that utilize vacuum tube topologies are still popular and sought after devices, especially in niche markets such as for high end home audio and for use as musical instrument amplifiers, e.g., as utilized to amplify guitar, bass guitar and other electronic instruments.

Many amplifier designs incorporate an output stage that operates in a "Push-Pull" mode. In push-pull mode, output devices are logically divided or otherwise grouped into a pair of output sections that operate in a complimentary fashion. In this regard, the two output sections provide amplification in anti-phase relative to the one another. The anti-phase amplified signals are combined in such a way that the signal currents add and certain distortion signals, such as distortion due to the non-linear characteristic curves of the output devices, subtract from one another. The result is that the pair of output sections can collectively provide more gain than a single output section by itself, and overall distortion is reduced.

Many amplifier designs alternatively incorporate an output stage that operates in a "Single Ended" mode. In single-ended mode, one or more output devices are driven in parallel by a single instance of an input signal having a single phase. As such, the gain of a single-ended amplifier is generally limited to the gain of the output device.

Push-pull amplifiers typically provide greater output power and wider bandwidth compared to single-ended amplifiers. Despite typically exhibiting less output power, single-ended amplifiers are still highly desired and sought after in many applications for their subjectively pleasing harmonic and tonal character, which differs from typical push-pull amplifiers, e.g., due to the distortion canceling byproduct of the push-pull configuration, which can tend to cancel more pleasing even order harmonics.

BRIEF SUMMARY

According to various aspects of the present invention, an amplifier having an alterable harmonic format comprises at least two amplifier modules forming an audio amplifier stage. At least a first one of amplifier modules comprises an active device, a servo and a mode control. The servo monitors an output signal that is derived from an output from the active device. Moreover, the mode control controls at least one of: an audio signal path to an input of the active device, and a feedback path from the servo to the input of the active device. The mode control has at least one setting that operates the active device as a servo loop controlled, current source.

According to further aspects of the present invention, an amplifier module having a variable bias current generator comprises an active device and an integrator. The integrator has a first input coupled to an output signal derived from the active device, a second input coupled to at least a fixed reference signal that sets a quiescent bias for the active device and an output that couples a direct current bias signal to the active device. The integrator forms a direct current servo around the active device to maintain a dynamically adjusted operating current for the active device.

According to still further aspects of the present invention, a power supply filter for an audio amplifier comprises a rectifier that rectifies an alternating current signal from a secondary of a power transformer, an active power device such as a power MOSFET, and a filter network. The filter network comprises, for example, a series connection of a first resistor and a first capacitor, the filter network extending from a first terminal of the active power device to ground. In this exemplary implementation, a first zener diode in provided in parallel with the first resistor of the filter network. Correspondingly, a second zener diode is provided between a second terminal of the active power device and the junction of the first resistor and the first capacitor of the filter network. Still further, a second resistor is provided between a control terminal of the active power device and the junction of the first resistor and the first capacitor of the filter network. A diode is coupled across the first terminal and a second terminal of the active power device, and an output of the power supply is taken at the source of the active power device. The power supply filter does not regulate to a fixed DC voltage, but rather, acts as a filter, that is suitable, e.g., for implementing amplifiers that operate in single-ended mode, as will be described in greater detail herein.

BRIEF DESCRIPTION OF THE SEVERAL VIEWS OF THE DRAWINGS

The following detailed description of various embodiments and other aspects of the present invention can be best understood when read in conjunction with the following drawings, where like structure is indicated with like reference numerals, and in which.

DETAILED DESCRIPTION

According to various aspects of the present invention, amplifier architectures are provided, having an output capable of exhibiting an alterable harmonic format. For instance, amplifier architectures are provided, which are capable of operation in a push-pull mode or a single-ended mode of operation. According to further aspects of the present invention, amplifier architectures are provided, which are capable of operating in a composite mode that is an intermediate of the push-pull and single-ended modes of operation. Thus, the harmonic signature of the amplifier output will be a composite of the signatures of single-ended and a push-pull modes. The composite mode may further be either continuously or incrementally adjustable between two or more settings. Still further, amplifier architectures are provided, which are capable of operation in a composite mode that is an intermediate of the push-pull and single-ended modes of operation, and at least one of a push-pull mode and a single-ended mode.

According to further aspects of the present invention, amplifier architectures are provided, which include servo circuitry associated with an output section of an amplifier. The servo circuitry provides a dynamic linearization signal in a closed feedback loop that transforms the corresponding output section into a servo loop controlled, linearized current source during operation of the amplifier in single-ended mode. The servo circuitry feedback loop is effectively broken during operation of the amplifier in push-pull mode, such that the output section functions as an amplification section to amplify an input audio frequency signal. Further, the dynamic linearization signal can be optionally mixed, e.g., blended, combined, scaled or otherwise comingled with the input signal to operate the amplifier in an composite mode to affect the harmonic content of the amplifier output as will be described in greater detail herein.

According to still further aspects of the present invention, amplifier architectures are provided, which include a direct current (DC) and low frequency servo circuitry that functions as a variable bias current generator. The variable bias generator allows output device idle current to be actively adjusted during operation, thus compensating for factors such as secondary rectification load line shift.

According to yet further aspects of the present invention, a low noise solid state power supply is provided for amplifiers, e.g., vacuum tube amplifiers, exhibiting load regulation attributes similar to those of a vacuum tube rectifier power supply, but which also provide low noise, e.g., low rail voltage ripple, suitable for use in powering an amplifier operating in single-ended mode of operation.

Figure 1:
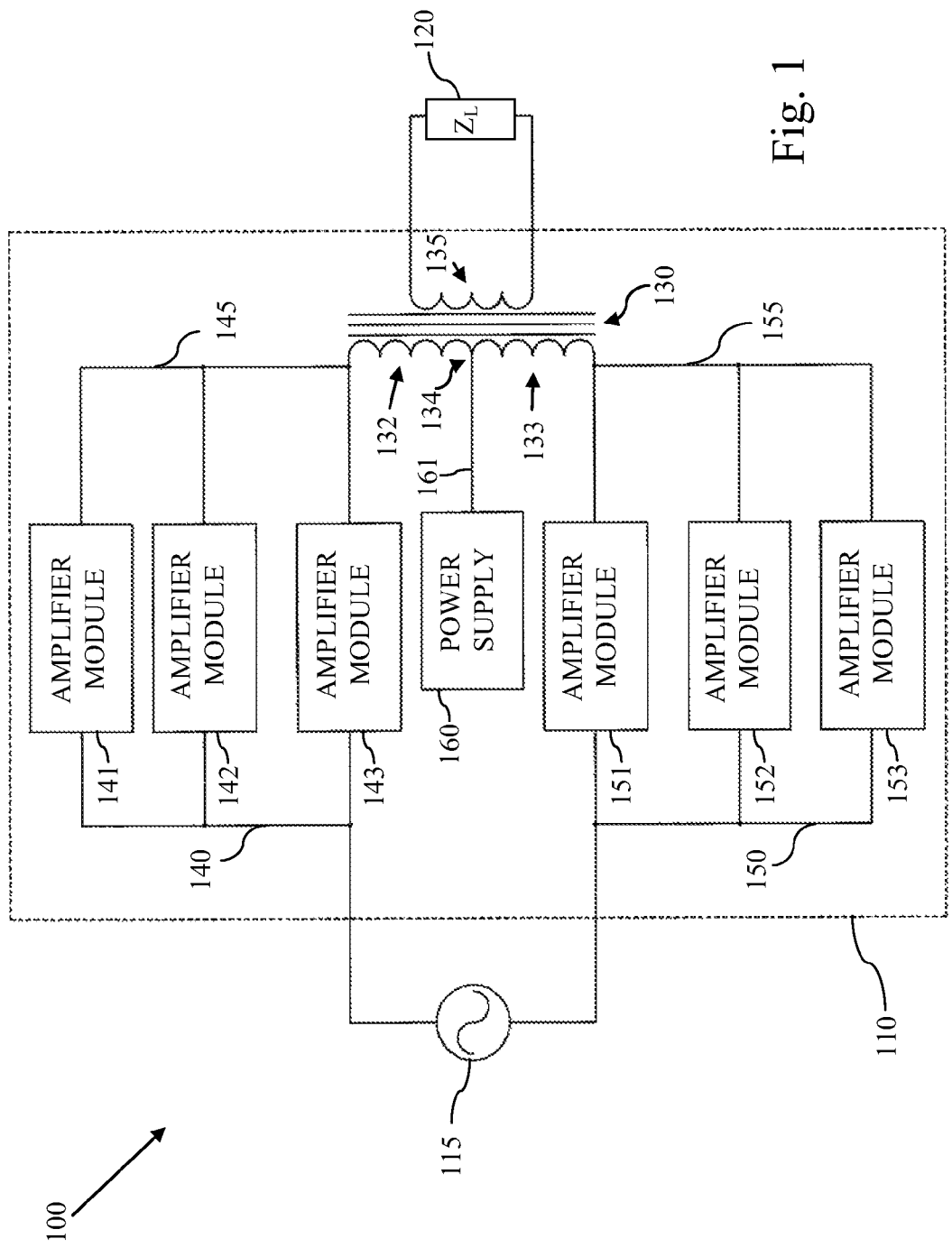
FIG. 1 is a block diagram of an amplifier system according to various aspects of the present invention.

Referring now to the drawings and particularly to FIG. 1, a block diagram of an amplifier system 100 is illustrated, in which various aspects of the present invention may be implemented. In general, the amplifier system 100 comprises an amplifier stage 110 that is connected between a signal source 115 and a load 120. As an illustrative example, the signal source 115 may comprise an audio frequency signal source, such as an audio pre-amplifier, instrument pre-amplifier, electronic instrument, microphone, or other source capable of delivering a signal to the amplifier stage 110 having signal information that resides in the audible frequency range.

The load 120 may be implemented as a simple resistor, e.g., which may be useful, for testing, research and other measurement applications. However in anticipated practical applications, the load 120 converts an electrical output signal of the amplifier stage 110 that is in the audio frequency, into sound. In that regard, the load 120 is likely complex, including resistive, capacitive and/or inductive components. For instance, the load 120 will typically comprise a loudspeaker system, which can include one or more voice coils of corresponding speakers, a frequency selective crossover network, a matching transformer for a ribbon or electrostatic speaker, etc.

In the illustrative implementation, an output of the amplifier stage 110 is coupled to the load 120 by an output transformer 130. The output transformer 130 comprises in general, a first primary 132, a second primary 133 and a primary winding center tap 134. The output transformer 130 also comprises a secondary 135 connected across the load 120. Depending upon the specific architecture of the amplifier stage 110, the output transformer 130 may be omitted, or alternatively, the output transformer 130 may be implemented using different configurations.

In the illustrative exemplary implementation, the signal source 115 provides a first input signal along a first input signal path 140 that couples to a first output section illustrated by amplifier modules 141, 142, and 143. Correspondingly, amplifier modules 141, 142 and 143 collectively provide a first output signal along a first output signal path 145 that couples to and drives the first primary 132 of the output transformer 130.

The signal source 115 also provides a second input signal along a second input path 150 that couples to a second output section illustrated by amplifier modules 151, 152 and 153. Correspondingly, amplifier modules 151, 152 and 153 collectively provide a second output signal along a second output signal path 155 that couples to and drives the second primary 133 of the output transformer 130. This configuration is thus suitable for push-pull mode of operation.

In practical terms, certain output devices are available in complimentary types, e.g., pnp and npn bipolar junction transistors, n-channel and p-channel field effect transistors, etc. If complementary devices are utilized for the first and second output sections, e.g., amplifier modules 141, 142, 143 and amplifier modules 151, 152, 153 respectively, then only a single-phase input signal from the signal source 115 is necessary to drive the push-pull output stage.

However, sometimes, it is convenient to use only a single type of device. Moreover, certain output devices such as vacuum tubes, are generally not available in complementary types. In this instance, the amplifier modules 141, 142, 143 and amplifier modules 151, 152, 153 may include identical types of output devices. However, in this configuration, the first output section, e.g., amplifier modules 141, 142, 143, is driven by a first instance of an input signal. Correspondingly, the second output section, e.g., amplifier modules 151, 152, 153, is driven by an instance of the input signal that is 180 degrees out of phase with the first instance of the input signal. Thus, the first input signal provided along the first input path 140 is 180 degrees out of phase with the second input signal provided along the second input path 150.

A power supply 160 couples to the center tap 134 of the output transformer 130 along connection 161. The power supply 160 may take on various architectures, and many features of the specific implementation of the power supply will depend, at least in part, upon the amplifier implementation. However, an exemplary power supply filter suitable for use with the power supply 160 is described in greater detail herein. Additionally, as illustrated, the amplifier stage 110 incorporates six amplifier modules 141, 142, 143, 151, 152 and 153 that collectively drive the output of the amplifier stage 110. However, in practice, any number of amplifier modules may be utilized. For instance, two or more modules are sufficient to implement various aspects of the present invention, as set out in greater detail herein. Moreover, other components and features may be provided as required by a specific implementation.

The amplifier stage 110 is suitable for use in a push-pull mode of operation. However, due at least in part to the implementation of one or more of the amplifier modules 141, 142, 143, 151, 152, 153, the amplifier stage 110 is also suitable for use in a single-ended mode of operation and optionally, in a composite mode of operation, as will be described more fully herein.

Amplifier Module Control System

Figure 2:
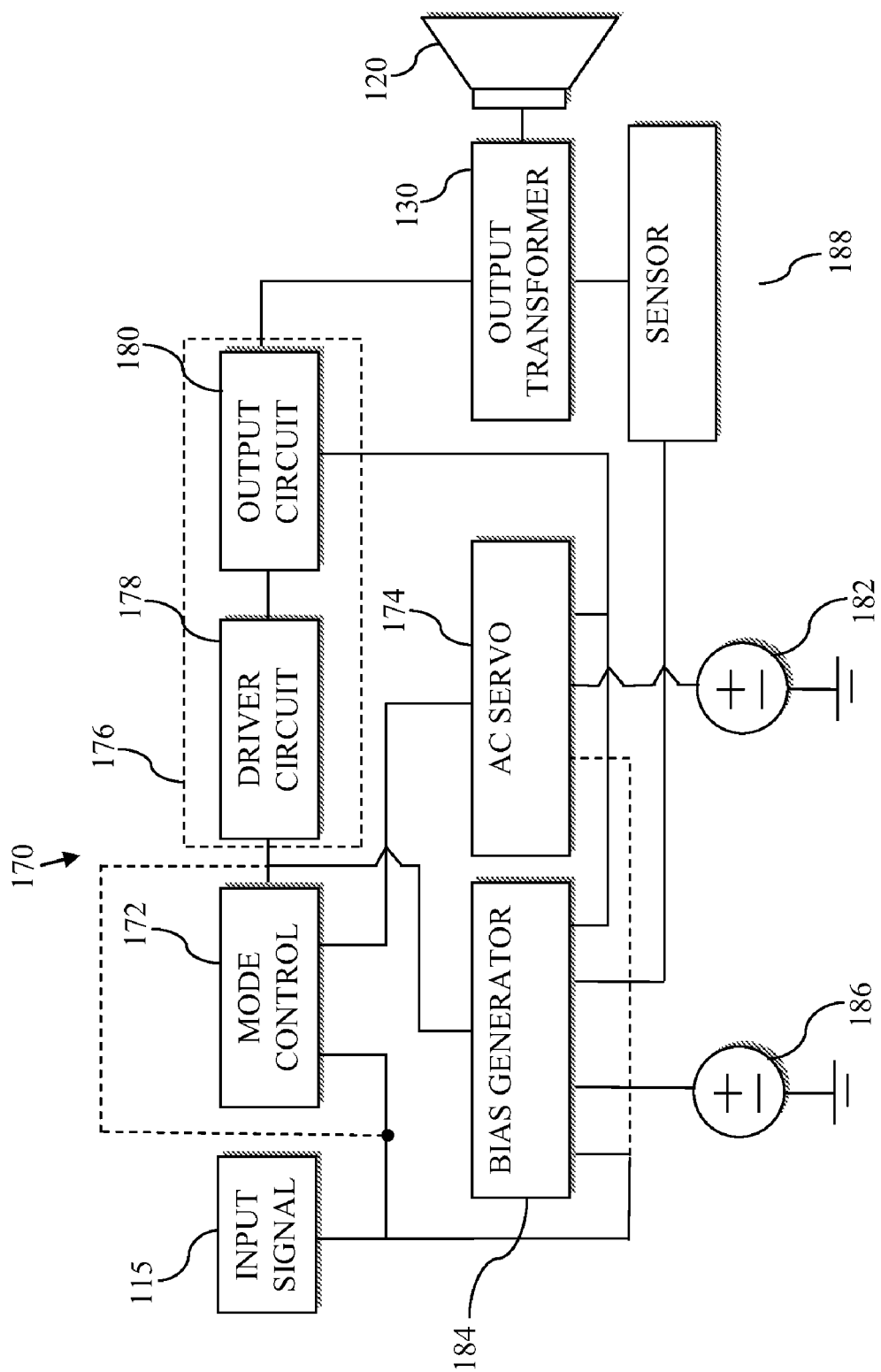
FIG. 2 is a block diagram of an amplifier module according to various aspects of the present invention.

Referring to FIG. 2, an amplifier module control system 170 is illustrated in block diagram form, according to various aspects of the present invention. The amplifier module control system 170 can be implemented as, or in conjunction with, one or more of the amplifier modules 141, 142, 143, 151, 152 and 153 of FIG. 1. The amplifier module control system 170 includes a mode control component 172 (also referred to generally herein as a mode control), an Alternating Current (AC) servo component 174 (also referred to generally herein as a servo), and an amplification component 176.

In general, the amplification component 176 includes a driver circuit 178 that provides the necessary signal conditioning to prepare a signal for amplification by an active device associated with an output circuit 180. The mode control component 172 determines whether the amplification component 176 functions as an audio signal output amplification module, e.g., such that a corresponding audio amplifier stage has a harmonic format corresponding to a push-pull mode, or as a current source, e.g., such that a corresponding audio amplifier stage has a harmonic format corresponding to a single-ended mode. The mode control components 172 may also and/or alternatively, determine whether the amplification component 176 operates in a composite mode, as will be described in greater detail herein. The AC servo component 174 enables the amplification component 176 to function as a servo loop controlled, linear current source, for example, when the corresponding amplifier stage is operated to have a harmonic format corresponding to a single-ended or composite mode.

In general, as described throughout this specification, the mode control component 172 may be implemented as one or more controls within and under the control of the amplifier circuitry, or the mode control component 172 may be implemented as one or more user-adjustable controls. As such, potentiometers, switches and other features that function as the mode control component 172, may, in various implementations, be implemented for user access and adjustability.

Amplifier Module as an Audio Frequency Amplification Module:

When the mode control component 172 configures the amplifier module control system 170 to operate as an audio signal amplification module, an audio frequency input signal, e.g., from the signal source 115, is coupled to the amplification component 176. In this regard, the audio input signal may be coupled to the amplification component 176 through the mode control component 172 or the audio input signal may be coupled directly to the amplification component 176, as schematically illustrated by dashed lines.

Further, the mode control component 172 effectively disconnects a feedback loop formed between the AC servo component 174 and the amplification component 176. For instance, the mode control 172 can open a circuit path that couples the feedback signal from the AC servo component 174 to the amplification component 176. Alternatively, the mode control 172 can substantially attenuate the feedback signal making the effect of the AC servo component 174 negligible on the performance of the active device of the output circuit 180 to function as an audio signal amplifier. Thus, the mode control component 172 controls an audio signal path to an input of the active device, and/or a feedback path from the AC servo component 174 to the input of the active device to operate the amplifier stage in a setting that functions with a harmonic format substantially similar to that of a traditional push-pull amplifier.

The output circuit 180 can utilize any type of active device, such as a vacuum tube, e.g., a pentode, tetrode, beam tetrode, or triode, or a solid state device, such as a power MOSFET, bipolar junction transistor, JFET, insulated gate bipolar junction transistor (IGBT), etc. In this regard, the supporting circuitry in the driver circuit 178 and/or the output circuit 180 will be dependent upon the selected type of active device. For example, the driver circuit 178 can implement a desired output impedance, drive current, frequency response, and/or other parameters to accommodate the selected active device implemented in the output circuit 180. As an illustration, the driver circuit 178 can be filter an input signal, e.g., to intentionally roll off some high frequency content. Further, in high gain guitar amplifiers, it may be desirable to provide a natural tone by implementing some frequency compensation at the driver circuit 178. Still further, in an amplifier that does not employ global feedback, a relatively low impedance may be desired for driving the active device of the output circuit 180.

As illustrated, the output circuit 180 may be transformer coupled to a load 120, e.g., a speaker. In this regard, the output circuit 180 is illustrated as optionally coupled to a primary winding of the output transformer 130, as described in greater detail herein. However, an output transformer is not required.

Servo Loop Controlled Current Source:

When the mode control component 172 configures the active device of the amplifier module control system 170 to operate as a current source, the control component 172 interacts with the AC servo component 174 to form a closed loop feedback control system around the amplification component 176, or at least around the active device of the output circuit 180, so as to operate the corresponding active device as a servo loop controlled, current source.

In operation, the AC servo component 174 monitors an output signal that is derived from an output from the active device. For instance, as illustrated in the block diagram, an output from the output circuit 180 is fed back to an input of the AC servo component 174. The AC servo component 174 provides the necessary filtering, scaling and/or other conditioning to the active device output. The output of the AC servo component 174 is coupled to the input of the amplification component 176 through the mode control module 172 as illustrated, forming a closed feedback loop.

The input signal, e.g., from the signal source 115, may be effectively disconnected from the amplification component 176 by the mode control module 172. For instance, the mode control 172 can open a circuit path that couples the input signal to the amplification component 176. Alternatively, the mode control 172 can substantially attenuate the input signal making its effect negligible on the performance of the active device of the output circuit 180 to function as a servo loop controlled current source. Thus, the mode control component 172 controls an audio signal path to an input of the active device, and/or a feedback path from the AC servo component 174 to the input of the active device.

The AC servo component 174 thus enables the active device of the output circuit 180 to function as a current source. According to various aspects of the present invention, the active device operates with near perfect linearity and transparent AC performance when employed as a current source. Utilization of an amplifier module as a current source is advantageous for operating an amplifier to have a harmonic format corresponding to a single-ended mode, as will be described in greater detail herein.

In this exemplary implementation, the AC servo component 174 forms a closed loop around the active device of the output circuit 180 and uses error compensation to bring the output of the active device into coincidence with a servo input. By way of illustration, the servo input may comprise a fixed reference 182, such as ground or some other fixed reference.

According to further aspects of the present invention, the AC servo component may also and/or alternatively receive an AC signal as an input, such as an audio signal as illustrated by dashed lines coupling the input signal to the AC servo component 174. Under this arrangement, the AC servo component 174 enables the active device of the amplification component 176 to function as a servo loop controlled, linear current source. However, the inclusion of an AC component to the input of the AC servo component 174 alters the behavior of the corresponding amplifier stage so as to operate having a harmonic format that is a composite, which includes signatures between push-pull mode and single-ended mode.

Thus, the mode control component 172 can optionally control the amplifier module control system 170 to operate in an composite mode. Under this arrangement, the mode control component 172 blends, combines, commingles or otherwise mixes an AC signal, e.g., an audio signal derived from the input source 115, with a fixed reference input or the feedback signal from the AC servo component 174, as will be described in greater detail herein.

Automated DC Biasing:

The amplifier module control system 170 can optionally also include a bias generator 184. For instance, the bias current generator 184 may comprise a direct current (DC) servo loop around the active device, e.g., to automatically adjust a direct current bias signal for the active device. The bias generator 184 functions as a variable bias current generator and allows an output device idle current to be actively adjusted during operation. Further, as will be described in greater detail herein, the bias generator 184 may utilize one or more inputs in any number of combinations. As such, the inputs to the bias generator 184 described herein are for purposes of illustration of types of inputs that may be combined in a given implementation.

In the exemplary implementation, the bias generator 184 is coupled to the signal path associated with the amplification component 176 downstream of the mode control module 172. Thus, a DC bias signal is applied to the input signal 115 regardless of whether the amplification component 176 is operated as an output amplifier, a current source or as a composite. As a few examples, the bias generator 184 may obtain a reference level from a fixed DC supply 186. Thus, the bias generator 184 can provide the necessary DC bias required for proper operation of the active device provided in the output circuit 180, e.g., to establish an idling bias or quiescent bias for an active device such as a vacuum tube. In this regard, although fixed during normal operation, the fixed DC supply 186 may be adjustable or otherwise programmable, e.g., by a user, to a predetermined DC value.

The bias generator 184 may also and/or alternatively dynamically vary the bias, e.g., to provide dynamic bias correction. For instance, an input to the bias generator 184 may be derived from an output of the active device tapped from the output circuit 180. An input to the bias generator 184 may alternatively and/or additionally be derived from a copy of the input signal 115. In this regard, the input signal may be filtered, rectified or otherwise processed for purposes of implementing dynamic bias adjustment by the bias generator 184.

Still further, an input to the bias generator 184 may alternatively and/or additionally be derived from a sensor 188 that is fed back from the output transformer 130. The utilization of a sensor 188 can be used to resolve low-frequency flux levels within the core of the output transformer 130. By way of illustration, the sensor 188 may be implemented as a magnetometer to provide a (low frequency limited) output signal corresponding to the magnetic flux level within the transformer 130. Thus, the bias generator 184 forms a loop that may be configured to maintain a predetermined desired magnetic operating point within the output transformer 130. As such, the bias generator 184 serves to set the DC operating current point based at least in part, upon the flux balance of the output transformer 130 via sensor 188.

In this regard, alternative methods to resolve and cancel out low-frequency flux levels may be implemented as set forth in the U.S. Pat. No. 7,348,845, entitled "SYSTEM AND METHOD FOR EMPLOYING VARIABLE MAGNETIC FLUX BIAS IN AN AMPLIFIER", issued Mar. 25, 2008, the disclosure of which is incorporated by reference herein in its entirety.

Exemplary Circuit Implementation of an Amplifier Module Utilizing a Triode

Figure 3:
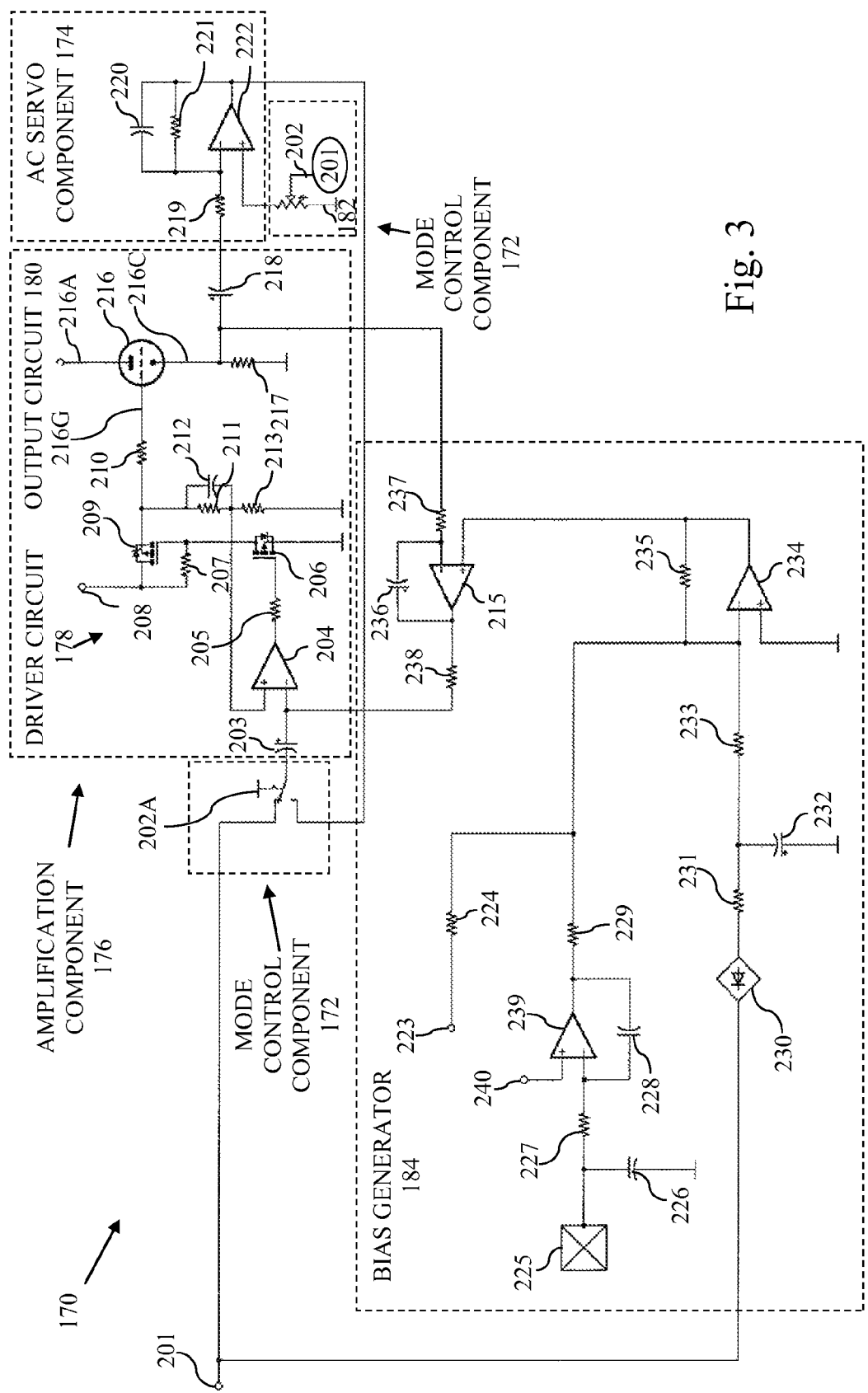
FIG. 3 is a schematic diagram of an amplifier module that employs a Triode according to various aspects of the present invention.

Referring to FIG. 3, an exemplary implementation of an amplifier module control system 170 is illustrated according to various aspects of the present invention.

As illustrated, an audio frequency input signal 201 is coupled to the mode control component 172 along a first circuit path. The mode control component 172 includes a switch 202A that provides at least two settings, and is logically illustrated as a single pole double throw switch. In practice, the switch 202A can be implemented using mechanical and/or electrical devices, e.g., a user controllable mechanical switch, a relay, one or more field effect transistors (FETS), etc. Moreover, the switch 202A can be user-adjustable control of the amplifier.

The switch 202A is configured to electrically couple the driver circuit 178 of the amplification component 176 between a select one of the input signal 201 and a feedback signal from the AC servo component 174. When the switch 202A is in a first switched state, also referred to herein as an "inactive" state, as schematically illustrated in FIG. 3, the switch 202A electrically couples the input signal 201 to the driver circuit 178, and correspondingly electrically disconnects the feedback from the AC servo component 174 to the driver circuit 178. Correspondingly, when the switch 202A is in a second switched state, also referred to herein as an "active" state, the switch 202A electrically disconnects the input signal 201 from the driver circuit 178, and correspondingly electrically couples the feedback from the AC servo component 174 to the driver circuit 178.

In the illustrative example, the driver circuit 178 drives the grid of an active device implemented as a triode of the output circuit 180. The driver circuit 178 always supplies both AC and DC signal components to the active device, regardless of whether the amplification component 176 is being operated as an audio amplifier or as a current source, as will be described in greater detail herein. That is, the bias generator 184 provides a bias signal to the driver circuit 178 independent of the state of the mode control component 172. Moreover, an AC component is provided to the driver circuit 178, either by virtue of an input audio signal 201, or a feedback signal from the AC servo component 174.

Amplifier Module as an Audio Frequency Amplification Module:

When the switch 202A is in the "inactive" state, an audio signal path that carries the input signal 201 is coupled through the switch 202A, and through an optional DC blocking capacitor 203 to the inverting input of an amplifier 204. The DC blocking capacitor 203 may be utilized, for example, where it is anticipated that an undesired DC voltage may be imposed with the audio frequency input signal 201. Moreover, the amplifier 204 also receives a DC servo integrator signal from the bias generator 184 directly at its inverting input to set the DC bias, as will be described in greater detail herein.

The output of the amplifier 204 is coupled through a resistor 205 to drive a control input of a first transistor 206, e.g., which may be implemented as a P-channel FET device. The resistor 205 limits the charging current at the gate of the FET, thus preventing or otherwise reducing the likelihood of radio frequency (RF) oscillation that may be induced into the driver circuitry by external environmental conditions. The first transistor 206 is biased by coupling the drain of the first transistor 206 through a resistor 207 to a suitable power supply connection 208. The source of the first transistor 206 is grounded. The resistor 207 is further positioned between the gate and drain of a second transistor 209, e.g., which may also be implemented as a P-channel FET device. The drain of the second transistor 209 also couples to the power supply connection 208. Thus, the resistor 207 further establishes the maximum gate driving current for the second transistor 209.

The source of the second transistor 209 implements the output of the driver circuit 178. The output of the second transistor 209 follows two circuit paths. In a first circuit path, the output of the second transistor 209 is electrically coupled through a resistor 210 to the active device, a vacuum tube triode 216 in the illustrative example. In this regard, the resistor 210 couples the signal from the driver circuitry to the grid of the triode 216 and functions as a grid stopper. Selection of the resistance value of resistor 210 can be utilized to both set the relative gain between the driver circuitry and the vacuum tube, and to prevent or otherwise reduce the likelihood of high frequency oscillation by forming a low pass filter in combination with the inherent Miller capacitance of the vacuum tube.

The output of the second transistor 209 is also coupled to a circuit formed by resistor 211, capacitor 212 and resistor 213. As illustrated, resistor 211 is in series with resistor 213 forming a voltage divider between the driver circuit output and ground. The divider circuit sets a voltage that is fed back to the non-inverting input of the amplifier 204. The voltage divider formed by resistors 211 and 213 further establish the overall voltage gain of the driver circuit stage for driving the control input of the triode 216 in this illustrative example. High frequency bandwidth is controlled by proper selection of capacitor 212, which is electrically connected in parallel across the resistor 211. The illustrated driver circuit 176 thus realizes a low output impedance and is further capable of high current drive of its output signal, suitable for driving the triode 216.

The triode 216 includes a grid connection 216G coupled to the driver circuit 176 via the grid stopper resistor 210. The triode 216 further comprises an anode connection 216A that serves as an output of the amplifier module 200. For instance, the output signal appearing across the anode connection 216A can be wired to either transformer primary 132 or 133 of the transformer 130 described with reference to FIG. 1. A cathode resistor 217 is tied between a cathode connection 216C and ground.

The mode control component 172, e.g., switch 202A, thus enables the audio signal path to couple an audio frequency signal to the input of the active device, e.g., through the switch 202A and the driver circuit 178 to the Triode of the output circuit 180 in this example. The mode control component 172 further effectively decouples a feedback loop from the AC servo component 174 to the input of the active device, e.g., due to the state of the switch 202A. As such, the active device functions as an audio amplification module and a corresponding audio amplifier stage, e.g., the circuit of FIG. 3 in combination with another amplifier module, has a harmonic format corresponding to a push-pull mode.

Amplifier Module as a Current Source:

If the switch 202A is activated, i.e., in the second switched state, the driver circuit 178 is electrically disconnected from the audio signal path, and thus the input signal 201. Moreover, the driver circuit 178 is electrically connected to a feedback from the AC servo component 174. The AC servo component 174 monitors an output signal that is derived from an output from the active device. In the illustrative example, AC current components from the triode 216 are present at the triode's cathode connection 216C, which appears as a voltage across resistor 217. The voltage across the resistor 217 is coupled through a capacitor 218, which provides DC isolation to the AC servo circuitry. The signal coupled across the capacitor 218 is input into the inverting input of an amplifier circuit formed by resistor 219, capacitor 220, resistor 221 and amplifier 222. The non-inverting input of the amplifier 222 is tied to a fixed reference, such as a connection to ground or some other desired potential, e.g., reference 182. The non-inverting input of the amplifier is tied in the figure to a potentiometer to illustrate a further aspect of the present invention. However, in practice, the potentiometer may be replaced by the fixed reference 182 for this illustrative example.

More particularly, the gain of the amplifier 222 is set by selection of resistor 219, which functions as an amplifier input resistor, and resistor 221, which functions as a feedback resistor tied between the inverting input of the amplifier 222 and the output of the amplifier 222. Capacitor 220 is optional and is provided, for example, to prevent high frequency oscillation. As illustrated, the capacitor 220 is tied in parallel with resistor 221. As such, the combination of the resistor 221 and the capacitor 220 form a low pass filter in the feedback loop of the amplifier 222. The non-inverting input of the amplifier 222 may be tied to ground.

The frequency response of the AC servo component 174 may be limited to the audible band of interest. In the illustrative example, the cathode coupled capacitor 218 sets the low frequency limit. This allows the bias generator 184 to operate independently of the AC servo component 174. The upper frequency limit of the AC servo component 174 can be controlled, for example, by capacitor 220.

The output of the amplifier 222 is tied back to the switch 202A. As such, when the switch 202A is set to the active position, i.e., second switched position, the output of the amplifier 222 is fed to the driver circuit 178 thus forming a closed feedback AC servo loop that causes the triode 216 to function as a linear (AC servo driven) current source. Linearity of the triode 216 when operated as a current source in this manner, is not dependant on its own intrinsic properties because the AC servo component 174 delivers sufficient gain in the feedback loop to overcome such intrinsic properties. This mode is useful when operating an amplifier in single-ended mode.

Thus, an input to the AC servo component 174 can comprise a fixed reference, e.g., a reference to ground at the non-inverting input of the amplifier 222. Moreover, the mode control component 172 effectively decouples an audio signal path from the input of the active device, e.g., via switch 202A, and closes a feedback loop from the servo to the input of the active device, also via switch 202A and through the driver circuit 178 in this example. Accordingly, the AC servo component 174 operates the active device as a servo loop controlled, current source and a corresponding audio amplifier stage has a harmonic format corresponding to a single-ended mode.

Amplifier Module Operating in Composite Mode:

The mode control component 172 may comprise at least one setting such that an audio signal path couples an audio signal, e.g., a copy of the audio signal from the input signal 201, to an input of the AC servo component 174 through the mode control component 172.

As noted above, the non-inverting input of the amplifier 222 can be tied to ground when operating the triode 216 as a servo loop controlled current source. However, the non-inverting input may alternatively and/or additionally be driven by an AC signal such as a copy of the audio input signal. For example, as schematically illustrated, the mode control component 172 may further and/or alternatively include a potentiometer 202B connected between ground or some fixed reference 182 and the non-inverting input of the amplifier 222. Moreover, the potentiometer 202B may be provided as a user-adjustable control. An audio signal path couples an AC signal such as the input audio signal from the input signal 201 to the wiper of the potentiometer 202B.

Thus, the potentiometer controls, e.g., scales or otherwise affects, an audio signal path to the input of the active device, i.e., through the AC servo component 174 to the AC servo feedback loop to the driver circuit 178 to the active device of the output circuit 180.

The mode control component 172 thus adjusts the audio signal coupled to the input of the AC servo component 174. For instance, as illustrated, the potentiometer 202B adds, blends, scales or otherwise combines the audio component to the zero volt reference at the non-inverting input of the amplifier 222. The active device operates as a servo controlled current source (with a variable reference). However, the inclusion of an AC component to the input of the AC servo component 174 brings the system to a mode where odd order harmonics are suppressed, but the overall amplifier output amplitude is increased significantly. Essentially, the overall amplifier realizes a response similar to a push-pull mode with odd order harmonics suppressed. The amount of this effect varies depending upon the setting of the wiper of the potentiometer 202B. The audio amplifier stage has a harmonic format established by the relative amount of the audio signal coupled to the input of the AC servo component 174. Moreover, where the potentiometer 202B is implemented as a user-adjustable control, a user can select a plurality of harmonic formats, e.g., based upon an adjustment of the user adjustable control.

The potentiometer 202B may be implemented as a user control. As such, a user can vary the amount of audio signal fed into the AC servo thus affecting the harmonic content of the output. In this regard, the amplifier is operating somewhere intermediate to push-pull and single-ended modes.

According to various aspects of the present invention, the potentiometer 202B can be used in conjunction with the switch 202A, or the potentiometer 202B can be used in lieu of the switch 202A. Still further, the potentiometer 202B can be replaced and/or combined with a switch, mixer or other structures to integrate the AC component into the AC servo component response.

Signal Biasing:

A bias generator 184 can optionally be employed as a variable bias current generator to dynamically maintain a proper operating current for the active device, i.e., the triode 216 in this illustrative example. The illustrative bias generator 184 employs a three input variable reference that enables the bias generator 184 to provide a dynamic triode bias point calculation. A first reference is made by a fixed voltage at input 223 that is coupled to the bias generator circuitry through a resistor 224. The voltage at the input 223 may be derived for example, from a source such as the fixed DC supply 186 described with reference to FIG. 2.

The second reference is provided by a sensor input 225, which may obtain a sensor input from a sensor 188 described with reference to FIG. 2. As an illustrative example, the sensor input 225 may be derived from a magnetometer that is placed in a small hole within the output transformer 130. The magnetometer can be placed, for example, on an axis to achieve an output signal corresponding to the magnetic flux level within the core of the transformer 130. The magnetometer output voltage appearing as input 225 is filtered by capacitor 226 and resistor 227 before entering integrator 239, e.g., by coupling the filtered magnetometer output to the inverting input of the integrator 239. Integration time is substantially determined by capacitor 228 positioned in the feedback loop between the integrator output and the inverting input of the integrator. Moreover, a reference flux level is established by voltage at reference 240 that is coupled to the non-inverting input of the integrator 239. The DC bias is thus adjusted in response to changes in the flux balance of the active device, e.g., the triode 216 in the illustrative example.

A third reference is derived from the input signal 201. More particularly, an instance of the input signal 201 is rectified by rectifier 230 and is filtered by a filter circuit, e.g., a low pass filter formed by resistor 231 and capacitor 232 to form an envelope of the input signal. The resistor 231 alters the charging time constant of capacitor 232 providing a mechanism to adjust the system attack and capacitor 232 filters the rectified input signal for a low ripple voltage.

The output of the filter circuit is coupled through resistor 233 to the inverting input of a summing amplifier 234. Similarly, the output of the integrator 239 is coupled to the inverting input of the summing amplifier 234 through resistor 229. Still further, the fixed voltage 223 is coupled through the resistor 224 to the inverting input of the summing amplifier 234. The non-inverting input of the summing amplifier 234 is tied to ground.

Thus, signal values corresponding to the first, second and third references are summed at the inverting input of a summing amplifier 234, which generates an output voltage proportional to summed value of the signal at its inverting input. Altering the values of resistors 224, 229, and 233 will affect the proportionality of each of the first, second and third references (fixed DC reference, flux balance and audio input signal envelope) respectively, relative to the output of the summing amplifier. Resistor 235, which is positioned in the feedback loop of the summing amplifier 234 between the output and the inverting input, adjusts overall gain of the summing amplifier 234.

The output of the summing amplifier 234 is coupled to the non-inverting input of an integrator 215. Additionally, a voltage across the triode's cathode resistor 217, which is proportional to the current draw by the triode 216, is coupled to the inverting input of the integrator 215 through resistor 237. Integration time of the integrator 215 is substantially determined by resistor 237 and a capacitor 236. Capacitor 236 is located in the feedback loop of the integrator 215. The integrator output is coupled to grid driver circuitry via resistor 238, e.g., by coupling to the inverting input of amplifier 204. As such, the bias generator 184 forms a loop between an output of the triode 216 feeding back to the input of the driver circuit 178. Moreover, the bias generator 184 serves to actively and dynamically adjust the bias current regardless of the mode of operation controlled by the mode control component 172.

As described in greater detail herein, an output transformer magnetic sensing method is utilized, e.g., via the input signal 225 fed into the bias generator 184, to provide an automatically generated and sustained DC bias that maintains the low frequency fidelity of audio output by the amplifier under normal operating conditions. According to further aspects of the present invention, low frequency audio fidelity is maintained, even with the employment of an output transformer 130, such as an un-gapped output transformer, even when the amplifier is operating in single-ended mode (switch 202A operating in the active state). Still further, the variable bias current implemented by the bias generator 184 allows the output device idle current to be actively adjusted during operation of the output component 174 as an amplification module, thus compensating for factors such as secondary rectification load line shift.

Although not illustrated in this figure, global feedback may also be implemented. However, various aspects of the present invention achieve a high bandwidth without the need for global or local feedback around the output device. As such, as the impedance of the speaker rises the lack of global feedback enables the amplifier to continue to drive the load creating the perception of a larger power amplifier. This is partially due to the low impedance, high current output of the driver circuit 178, which is capable of driving difficult capacitive loads such as the grid of a triode operating at high frequency with minimal distortion and loss.

Exemplary Circuit Implementation of an Amplifier Module Utilizing a Pentode

Figure 4:
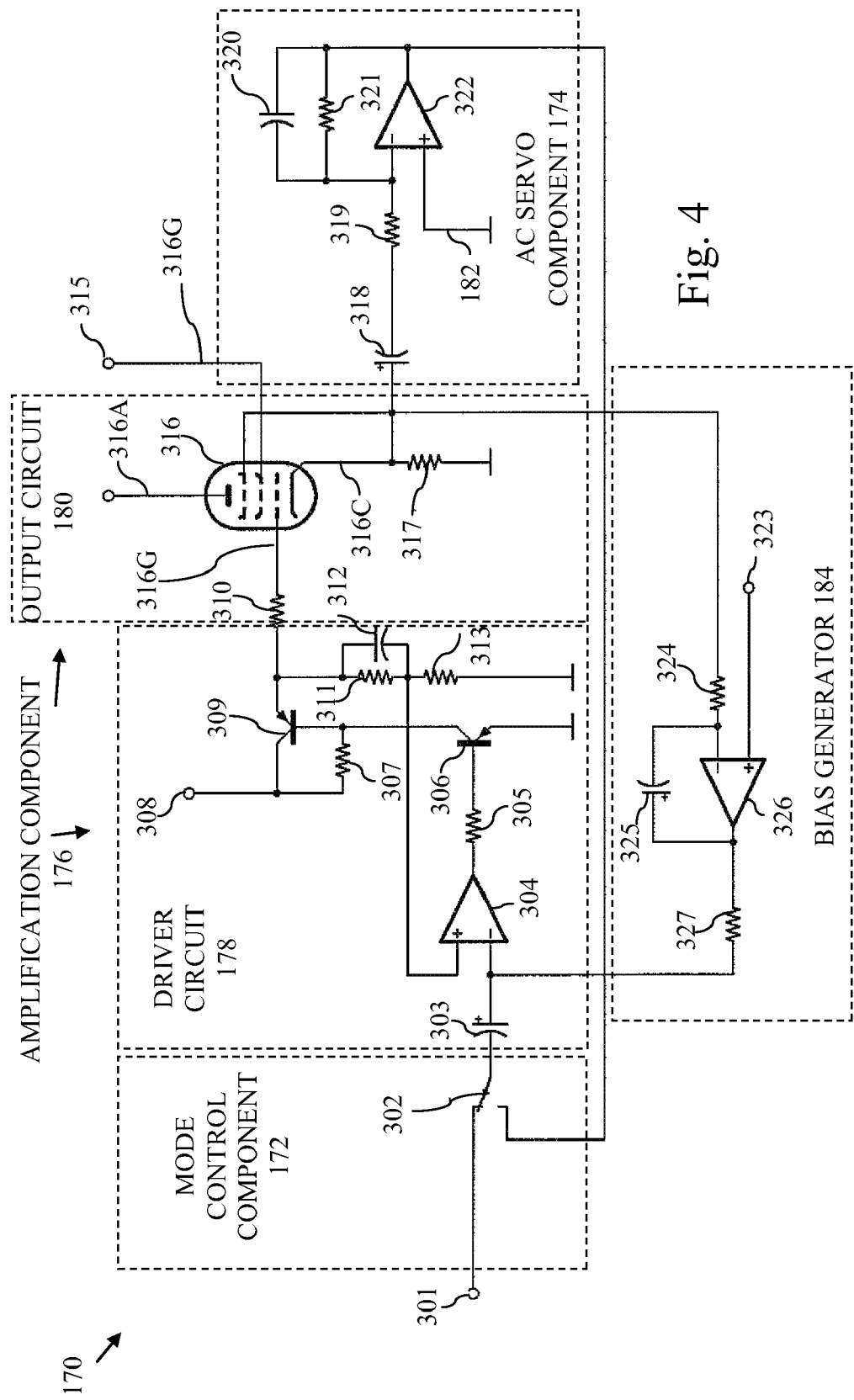
FIG. 4 is a schematic diagram of an amplifier module that employs a Pentode according to various aspects of the present invention.

Referring to FIG. 4, an exemplary implementation of an amplifier module control system 170 is illustrated according to various aspects of the present invention.

As illustrated, an audio frequency input signal 301 is coupled to the mode control component 172 along a first circuit path. The mode control component 172 includes a switch 302A that is analogous in operation to the switch 202A of FIG. 3.

When the switch 302 is in the "inactive" state, the switch 302 electrically couples the input signal 301 to driver circuit 178, and correspondingly electrically disconnects the AC servo feedback from the driver circuit 178. As such, the amplifier module control system 170 is operated as an audio amplification module in a manner analogous to that described more fully herein.

In the illustrative example, the driver circuit 178 drives the grid of an output circuit 180, which is implemented as a Pentode vacuum tube. Moreover, The driver circuit 178 always supplies both AC and DC signal components to the active device 180, regardless of whether the amplification component 176 is being operated as an audio amplifier or as a current source.

Amplifier Module as an Output Amplifier:

When the switch 302 is in the "inactive" state, the signal input 301 is coupled to the driver circuit 178, which is analogous in operation to the driver circuit described with reference to FIG. 3. Particularly, the input signal 301 is coupled through an optional DC blocking capacitor 303 to the inverting input of an amplifier 304. The output of the amplifier 304 is coupled through a resistor 305 to drive a control input of a first transistor 306, e.g., a PNP bipolar junction transistor device. As illustrated, the base of the first transistor 306 is coupled to the resistor 305, the emitter of the first transistor 306 is coupled to ground and the collector of the first transistor 306 is biased through resistor 307 from a suitable power supply connection 308. The resistor 307 further establishes the maximum base current for a second transistor 309, e.g., which may also be implemented as a PNP bipolar junction device. As illustrated, the resistor 307 is connected between the collector and base of the second transistor 309. The second transistor 309 also receives a voltage from the power supply 308 connection via the collector of the second transistor. The emitter of the second transistor 309 defines the output of the driver circuit.

The output of the second transistor 309 follows two circuit paths. In a first circuit path, the output of the second transistor 309 is electrically coupled through a resistor 310 to the Pentode vacuum tube. The output of the second transistor 309 is also coupled to a circuit formed by resistor 311, capacitor 312 and resistor 313. As illustrated, resistor 311 is in series with resistor 313 forming a voltage divider between the driver circuit output and ground. The voltage divider sets a voltage that is fed back to the non-inverting input of the amplifier 304. The voltage divider formed by resistors 311 and 313 further establish the overall voltage gain of the driver circuit stage for driving the control input of the Pentode vacuum tube in a manner analogous to that described with reference to FIG. 3. The illustrated grid driver circuitry thus realizes a low output impedance and is further capable of high current drive of its output signal.

The Pentode includes a grid connection 316G coupled to the driver circuitry via the grid stopper resistor 310. The Pentode 316 further comprises an anode connection 316A that serves as an output of the amplifier module 300 via connection line 314. For instance, the output signal appearing across the anode connection 316A can be wired to either transformer primary 132 or 133 of the output transformer 130 of FIG. 1. The Pentode also comprises a screen connection 316S connected to a fixed voltage via connection 315 and a cathode connection 316C connected to a cathode resistor 317.

Amplifier Module as a Current Source:

If the switch 302 is in the activated state the driver circuit 178 is electrically disconnected from signal source 301 and instead the grid of Pentode 316 becomes part of and receives an AC signal that is generated by the AC servo component 174 in a manner analogous to the AC servo circuit 182 of FIGS. 2 and 3. For example, AC current components from the Pentode are present at the Pentode cathode connection 316C, which appears as a voltage across resistor 317. The voltage that appears across the Pentode cathode connection via resistor 317 is coupled through capacitor 318, which provides DC isolation to the AC servo component 174. The signal coupled across the capacitor 318 is input into the inverting input of an amplifier circuit formed by resistor 319, capacitor 320, resistor 321 and amplifier 322, which function in an analogous function to similar components described with reference to FIG. 3. Moreover, the non-inverting input of the amplifier 322 is tied to a voltage reference 182, e.g., ground in the illustrative example, but may alternatively and/or additionally be tied to an audio frequency control signal, e.g., that feeds in a portion of the input audio signal to an input of the AC servo component 174 in a manner analogous to that set out by the optional potentiometer control 202B described with reference to FIG. 3.

The output of the amplifier 322 is tied back to the switch 302, which couples the output of the amplifier 322 to the driver circuit 178 forming an AC servo driven current source when the switch 302 is in the active state. Linearity of Pentode 316 when operated as a current source is not dependant on its own intrinsic properties where sufficient gain is provided in the described linearization system implemented by the AC servo component 174.

Signal Biasing:

A bias generator 184 is employed to maintain a proper operating current point and flux balance of the active device 316, e.g., the Pentode in the illustrative example. The bias generator is analogous to the bias generator described with reference to FIGS. 2 and 3, except that only a single input reference is utilized for bias generation for purposes of clarity of discussion. More particularly, the DC bias source includes DC bias circuitry comprising a fixed voltage input 323, e.g., from a fixed reference such as the fixed DC supply 186 described with reference to FIG. 2. The bias generator 184 is further built around resistor 324, capacitor 325, integrator 326 and resistor 327. The input 323 is coupled to the non-inverting input of the integrator 326. The resistor 324 couples the voltage appearing across cathode resistor 317, which is proportional to output device 316 current draw, to the inverting input of the integrator 326. Integration time is substantially determined by resistor 324 and capacitor 325, which is located in the feedback loop between the output and the inverting input of the integrator 326. The integrator output is coupled to grid driver circuitry via resistor 327.

Although not illustrated in this figure, global feedback may be implemented. However, various aspects of the present invention achieve high bandwidth without the need for global or local feedback around the output device, in a manner analogous to that described with reference to FIG. 3.

Exemplary Circuit Implementation of an all Tube Module Utilizing a Pentode

Figure 5:
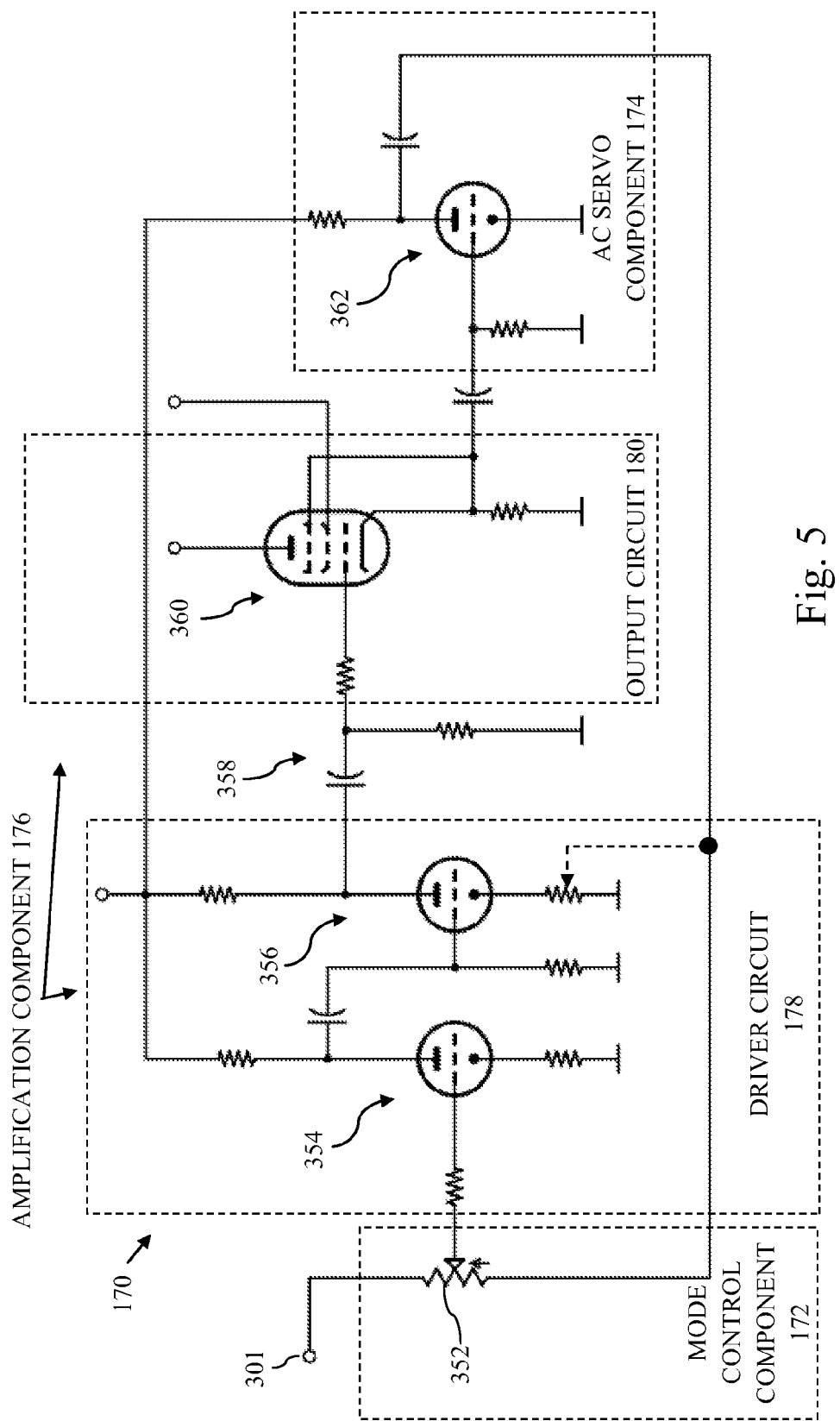
FIG. 5 is a schematic diagram of an amplifier module using vacuum tubes for a driver and an AC servo, according to various aspects of the present invention.

Referring to FIG. 5, an exemplary implementation of an amplifier module control system 170 is illustrated according to various aspects of the present invention. As illustrated, an audio frequency input signal 301 is coupled to the mode control component 172 along a first circuit path. Moreover, the feedback signal from the AC servo component 174 is coupled to the mode control component 172 along a second circuit path. As illustrated, the mode control component 172 includes a potentiometer 352 that blends the input audio signal with an output from the AC servo component 174. In operation, the potentiometer 152 functions analogously to the potentiometer 302B described with reference to FIG. 3 in that the potentiometer 352 serves to alter the harmonic format of the overall amplifier.

With the potentiometer 352 is at 100% rotation, the system 170 behaves similarly to a traditional amplification module. The input signal 301 is coupled to driver circuit 178. There is some component of the output of the AC servo component 174 coupled to the driver circuit 178 as well. However, the output of the AC servo is sufficiently attenuated by the resistance of the potentiometer 352 to render the effects of the AC servo component 174 negligible. In an illustrative example, the driver circuit 178 is implemented as a pair of conventional cascaded common cathode, triode gain stages 354, 356. The input signal 301 is thus effectively coupled to the grid of the first common cathode triode gain stage 354 through a grid stopper resistor. The output taken at the anode of the first common cathode triode gain stage 354 is capacitively coupled to the grid the second common cathode triode gain stage 356 through a grid lead resistor.

The output taken at the anode of the second common cathode triode gain stage 356, is coupled through a high pass filter 358 to the output circuit 180. In a manner analogous to that described with reference to FIG. 4, the active device is implemented as a pentode 360, which includes a grid connection coupled to the output of the high pass filter 358 via a grid stopper resistor. The pentode 360 further comprises an anode connection that serves as an output of the amplifier module. For instance, the output signal appearing across the anode connection of the Pentode 360 can be wired to either transformer primary 132 or 133 of the output transformer 130 of FIG. 1. The Pentode also comprises a screen connection connected to a fixed voltage and a cathode connection connected to a cathode resistor.

With the potentiometer 352 is at 0% rotation, the system 170 behaves similarly to a servo controlled current source. The output of the AC servo component 174 is coupled to the driver circuit 178, thus forming a closed servo loop. There is some component of the input signal 301 coupled to the driver circuit 178 as well. However, the input signal 301 is sufficiently attenuated by the resistance of the potentiometer 352 to render the effects of the audio signal negligible.

In the exemplary implementation of FIG. 5, the AC servo component 174 is implemented as a common cathode triode gain stage 362. The voltage appearing across the cathode resistor of the Pentode 360 is capacitively coupled to the grid the triode gain stage 362 through a grid lead resistor. The output taken at the anode of the triode gain stage 362 is capacitively coupled to the potentiometer 352 of the mode control component 172. In this regard, a closed feedback loop is formed between the driver circuit 178, the output circuit 180 and the AC servo component 174 as described more fully herein. In the 0% position, the Pentode is fully linearized and the harmonic format of the amplifier is altered to a predominately even order format.

As the potentiometer 352 is rotated between 0% and 100%, an audio frequency signal is mixed with the servo control feedback. As a result, the harmonic format of the amplifier is altered to a composite harmonic format in a manner analogous to that described more fully herein.

As with previous examples, the AC servo component 174 monitors an output signal that is derived from an output from the Pentode. Moreover, the mode control component 172 comprises a potentiometer that controls both an audio signal path and a feedback path from the servo, to the input of the active device. More particularly, the potentiometer, or other suitable circuitry, scales at least one of an audio frequency signal and a feedback signal from the feedback path of the servo, and mixes the two signals together. The mixed signal, e.g., at the wiper of the potentiometer, is coupled to the input of the active device, through the driver circuit in the illustrative example. Thus, the active device operates as a servo controlled current source and the audio amplifier stage has a harmonic format established by the relative balance of the audio frequency signal and the servo feedback signal fed to the input of the active device.

In this regard, other arrangements may alternatively be implemented. For instance, the potentiometer 352 could be replaced by a potentiometer that replaces the cathode resistor of the triode 356 in the driver circuit 176. In this regard, the new potentiometer, illustrated in dashed lines, scales only the feedback from the AC servo component 174. Further, the audio signal may thus be coupled directly to the driver circuitry 178. In this illustrative example, the mixing of the AC servo feedback and the audio signal does not occur at a single connection, but is rather distributed throughout the circuit.

The illustrated example of FIG. 5 does not included DC Servo. This configuration will work best with a cathode biased class A pentode output stage amplifier because of the fairly steady plate current and lack or near lack of secondary rectification and subsequent load line shifts. Therefore, a bias generator is not truly necessary.

Figure 6:
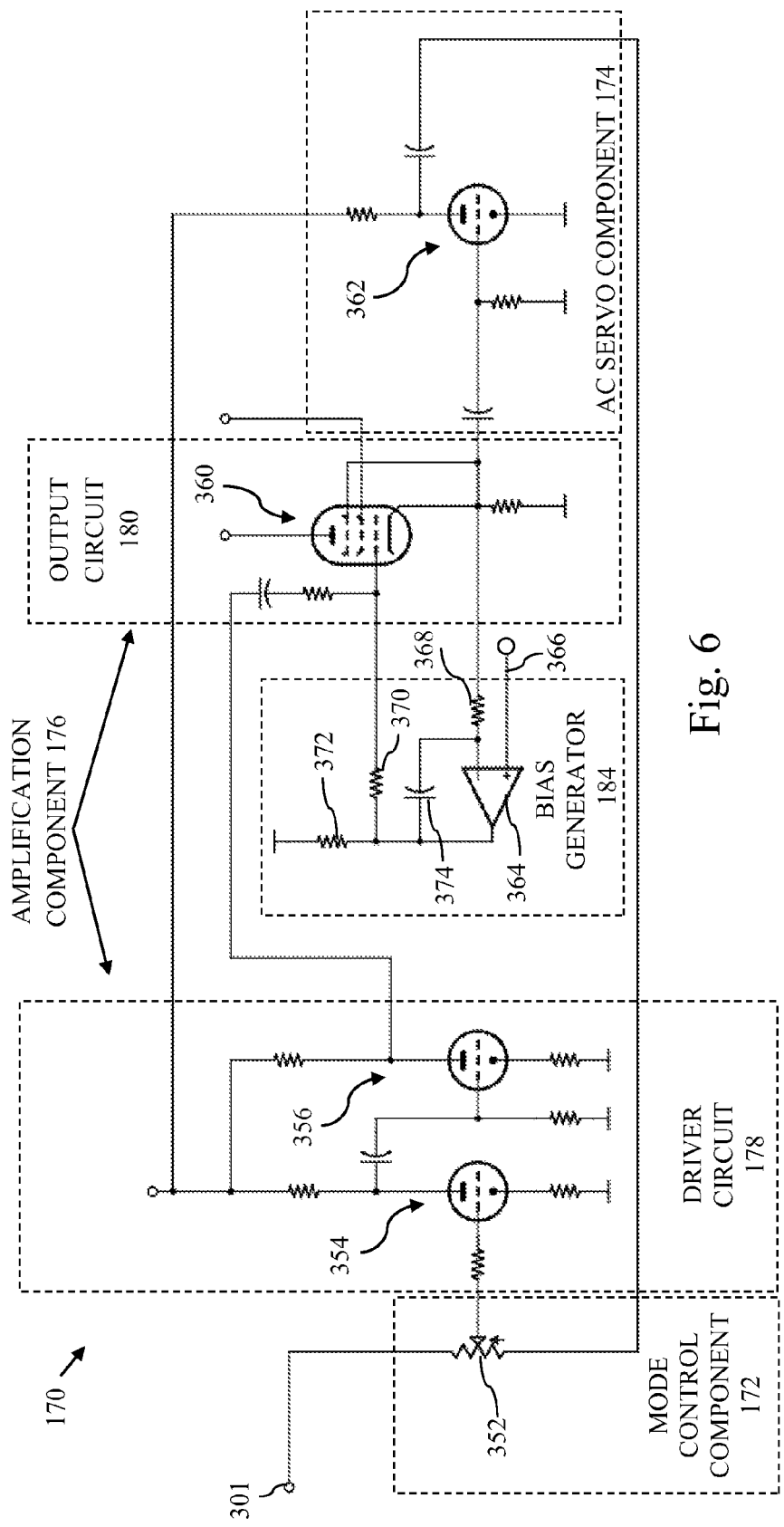
FIG. 6 is a schematic diagram of another illustrative amplifier module using vacuum tubes for a driver and an AC servo, according to various aspects of the present invention.

Referring to FIG. 6, an exemplary implementation of an amplifier module control system 170 is illustrated according to further aspects of the present invention. The system of FIG. 6 is similar to the system of FIG. 5. As such, like components are indicated with like reference numerals. In this regard, the circuit of FIG. 6 functions analogously to the circuit FIG. 5 except as noted below. The output of the illustrated driver circuit 178 couples to the output circuit 180 through a coupling capacitor and a grid stop resistor. Moreover, a bias generator 184 is provided.

More particularly, DC biasing for the pentode 360 is provided via the bias generator 184. In this simplified exemplary illustration, the bias generator 184 comprises an integrator 364. A fixed reference voltage is provided to the non-inverting input of the integrator 364 via the input 366. The reference may be provided, for example by the fixed DC supply 186 described with reference to FIG. 2. The inverting input of the integrator 364 is coupled to the cathode of the pentode 360 through resistor 368. The output of the integrator 364 supplies a DC bias to the grid of the pentode 360 through resistor 370, thus forming a closed DC servo feedback loop. The resistor 372 forms part of an integration timing circuit with a capacitor 374 that is positioned in the feedback loop between the output and inverting input of the integrator 364. The resistor 370 in a relatively high resistance and is provided for isolation.

Exemplary Amplifier Circuitry

Figure 7:
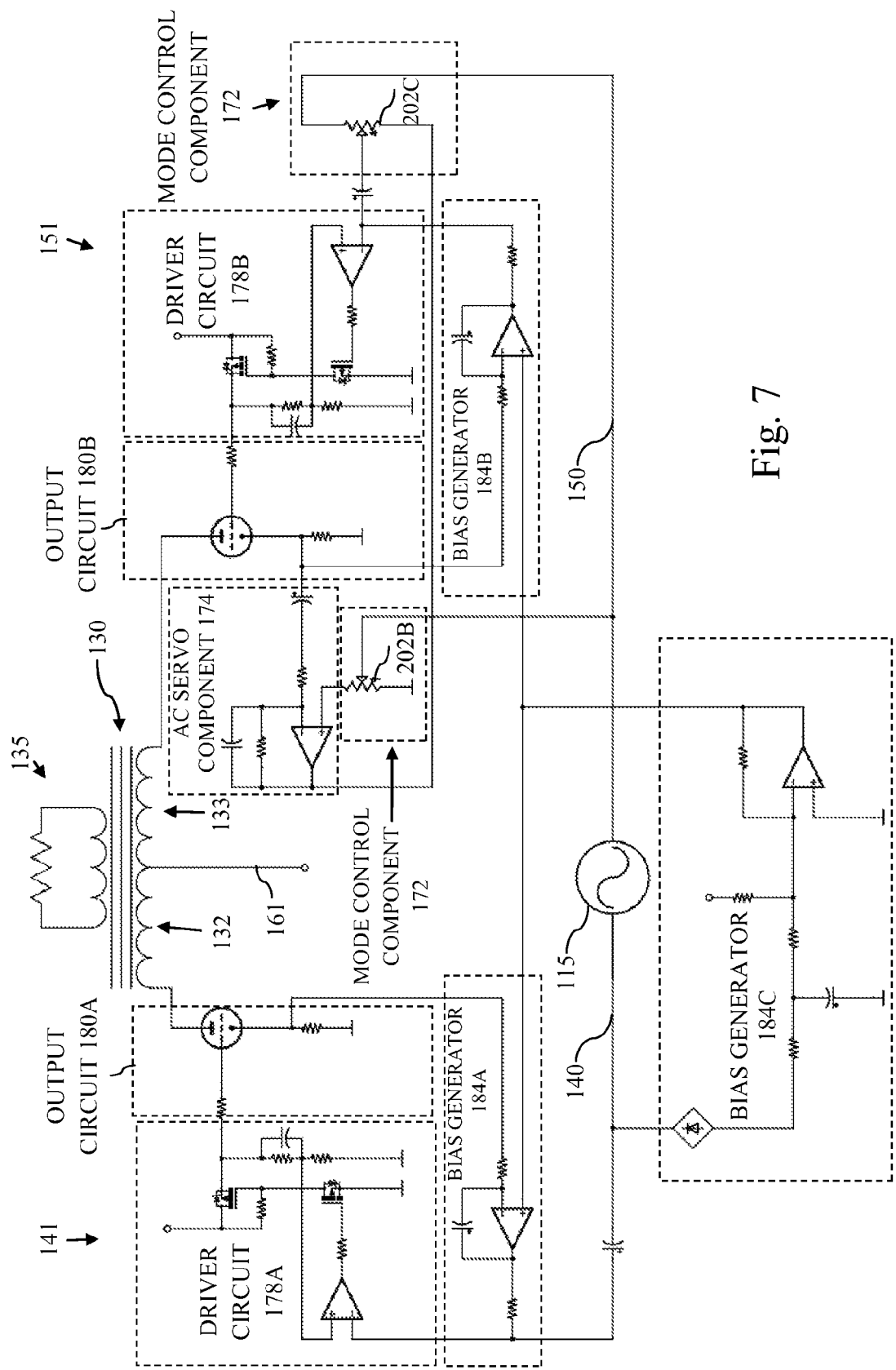
FIG. 7 is a schematic diagram of an amplifier system that employs Triode amplifier modules that can be configured for alterable harmonic content, according to various aspects of the present invention.

Referring to FIG. 7, and exemplary implementation of an amplifier stage is illustrated according to various aspects of the present invention. The illustrated amplifier stage utilizes two active devices to provide an amplifier capable of push-pull, single-ended and composite modes as described more fully herein.

The signal source 115 provides a first input signal along a first input signal path 140 that couples to an amplifier module 141 that utilizes a triode as the active device of its output circuit 180. Correspondingly, the amplifier module 141 provides a first output signal from its triode along a first output signal path 145 that couples to and drives the first primary 132 of the output transformer 130. The signal source 115 also provides a second input signal along a second input path 150 that couples to amplifier module 151 that also utilizes a triode as the active device of its output circuit 180. Correspondingly, amplifier module 151 provides a second output from its triode that couples to and drives the second primary 133 of the output transformer 130. As schematically illustrated, the first input signal provided along the first input path 140 is 180 degrees out of phase with the second input signal provided along the second input path 150.

As described in greater detail herein, regardless of the operating mode, the bias generator 184 provides a DC bias to the triodes. By way of illustration, the bias generator is illustrated as two mirrored circuit topologies, designated bias generator 184A and bias generator 184B, which are each generally analogous in function to the circuit elements 215, 236, 237 and 238 described with reference to FIG. 3. Moreover, both the bias generator 184A and the bias generator 184B obtain an input at their respective non-inverting input of the integrator from a bias generator 184C, as will be described in greater detail herein. However, the bias generator 184A receives an input signal at the inverting input of its integrator from an output of the triode associated with amplifier module 141. For instance, as illustrated, the input at the inverting input of the integrator associated with bias generator 184A is derived from a voltage across a cathode resistor of the triode of the output circuit 180A. Similarly, the bias generator 184B receives an input signal at the inverting input of its integrator from an output of the triode associated with amplifier module 151. For instance, as illustrated, the input at the inverting input of the integrator associated with bias generator 184B is derived from the voltage across the cathode resistor of the triode of the output circuit 180B.

The bias generator component 184C provides the bias generator component inputs that are common both to the bias generator 184A and the bias generator 184B. In the illustrative example, the bias generator 184C includes a summing amplifier that sums the rectified and high pass filtered copy of an audio signal from the signal source 115 and a reference voltage, such as from the fixed DC supply 186, in a manner analogous to that described with reference to components 223, 224, 230, 231, 232, 233, 234 and 235 described with reference to FIG. 3, herein.

However, in the context of magnetic flux correction, a flux correction of equal phase is required for both amplifier modules 141 and 151 as one side of the circuit must have a correction 180° relative to the other side for proper operation thereof. As such, integrating magnetometer sensor information into the common bias generator 184C is not practical.

The driver circuit 178A and the corresponding output circuit 180A operate as an amplifier module regardless of the overall operating mode of the amplifier.

The remainder of the circuit, including the mode control components 172, the driver circuit 178B and the output circuit 180B are analogous to those similar components described with reference to FIG. 3, except that the switch 202A, described with reference to FIG. 3 has been replaced with the potentiometer 202C. In an exemplary implementation, the potentiometer 202B and the potentiometer 202C may be provided as a dual gang potentiometer so that the user is presented with only a single control to operate. According to further aspects of the present invention, the illustrated potentiometer 202C could be replaced with the switch 202A, described with reference to FIG. 3.

When both the potentiometer 202B and the potentiometer 202C are in the 100% rotated position, the input signal is coupled to the driver circuit 178B. Feedback from the AC servo component 174 is also coupled to the driver circuit 178B. However the AC servo output is heavily attenuated by potentiometer 202C so as to render the effect of the AC servo component 174 negligible. In this state, the driver circuit 178B and output circuit 180B function as an amplifier module such that the overall amplifier functions with a harmonic signature similar to push pull mode, in a manner analogous to that described more fully herein.

When the potentiometer 202B and the potentiometer 202C are in the 0% position, the output of the AC servo component 174 is in a closed feedback loop with the driver circuits 178B and the output circuit 180B. Moreover, if the fixed reference of the AC servo component 174 is ground, then the audio signal will be effectively removed from the input to the driver circuit 178B. In this mode, the amplifier module 151 functions as a linearized servo controlled current source, as described in greater detail herein. As such, the amplifier operates with a harmonic format corresponding to a single-ended mode.

When the potentiometers 202B and or 202C are adjusted to positioned between 0% and 100%, the amplifier module 151 functions in an composite mode a harmonic format corresponding to an intermediate between push-pull and single-ended mode, depending upon the potentiometer settings, in a manner analogous to that described in greater detail herein. Notably, potentiometer 202, which is tied to the non-inverting input of AC servo amplifier, has its wiper connected to the input audio signal, and thus provides a mechanism for the user to alter the harmonic output of the amplifier system, e.g., by scaling or otherwise modifying the AC or variable reference to the AC servo. For instance, by adjusting the potentiometer, the voltage input to the AC servo amplifier may be shifted from a fixed reference such as a ground potential to an input composed entirely of signal input from the signal source.

Thus, the inclusion of the potentiometer 202B provides for the ability to operate in an composite mode between single-ended and push-pull. In this adjustment, harmonic content is altered from significantly similar to that of a traditional push-pull amplifier all the way to operation with harmonic output substantially similar to a traditional single-ended amplifier.

As yet another illustrative example, the potentiometer 202C can be replaced with a switch 202A, e.g., which can be physically implemented as a switch integrated with the potentiometer 202B. In this regard, a user would rotate the potentiometer counterclockwise until it clicks to the off position. In this state, the switch functions in its inactive mode, such that the AC input signal is coupled to the driver circuitry and the feedback from the AC servo component 174 is switchable disconnected. Thus, the amplifier operates in push-pull mode of operation. As the potentiometer is rotated clockwise, the switch clicks to the activated position setting the amplifier stage to AC servo mode. In this arrangement, as the potentiometer is rotated clockwise, the wiper moves, transitioning the amplifier through various setting of a composite mode analogous to that described more fully herein.

Miscellaneous Considerations

Prior attempts to implement both push-pull and single-ended amplifier topologies in a single amplifier system employ an output transformer limited in performance and fidelity by virtue of the special design considerations required for proper operation in single-ended mode. For instance, a traditional single-ended amplifier will impose a net DC magnetic bias on the transformer core. In an un-gapped magnetic core, this magnetic bias causes early magnetic saturation and as consequence reduced output power and increased distortion. However, an output transformer capable of handling a large degree of net DC bias will have a physical gap introduced within the magnetic path resulting in a shearing of the hysteresis loop and subsequent greater capacity to handle DC current before saturation. A negative consequence from this shearing is a lower equivalent primary inductance and poor low frequency performance.

However, according to various aspects of the present invention, an amplifier system is provided, that comprises an output having a harmonic format that corresponds with both push-pull and single-ended mode operation without a loss or degradation in low frequency response and performance. Moreover, according to further aspects of the present invention, the output harmonic signature may be altered by a user, e.g., by adjusting the potentiometer or other adjustable control, to provide a user adjustable output harmonic format providing intermediate harmonic properties between those typical of a single-ended and push-pull amplifier.

As described more fully herein, a variable bias current generator allows output device idle current to be actively adjusted during operation, thus compensating for factors such as secondary rectification load line shift. This results in ideal magnetic neutrality within the output transformer under all operating conditions. Moreover, various aspects of the present invention achieve high bandwidth without the need for global or local feedback around the output device. This is partially due to the low impedance, high current output of the driver circuitry 178.

Moreover, traditional audio frequency amplifiers that employ vacuum tubes as output devices suffer from the effects of Miller capacitance. This capacitance at the control input of a vacuum tube may reduce high frequency response and introduce substantial and audible phase shift to the output signal. The Miller Effect is most pronounced in the triode where input capacitance is a function of plate to grid capacitance and triode gain. Some of the negative effects due to Miller capacitance may be ameliorated if an amplifier output stage employs negative feedback. However, negative feedback around the output stage seriously alters the harmonic content of the output signal. For an instrument amplifier, such as guitar amplifier employing a triode output stage, this negative feedback results in a harmonic structure alteration which negates most of the tonal advantages afforded by the implementation of the triode.

Because of the high grid to plate capacitance inherent in large power triodes such as the 6C33C, 6C33C-B and 6C33C-BP, and negative tonal consequences of feedback, implementation of such tubes has not been achieved in a guitar and or instrument amplifier. However, according to various aspects of the present invention, the negative effects of Miller capacitance have been overcome for such triodes, e.g., by the driver circuits as described more fully herein. Thus, various aspects of the present invention overcome the negative effects of Miller capacitance and provide a capacity to employ vacuum triodes such as the 6C33C, 6C33C-B and 6C33C-BP in an instrument amplifier, such as a guitar amplifier.

Although FIG. 7 is illustrated with two amplifier stages, in practice, more than two stages may be utilized in a manner analogous to that set out more fully herein. For maximum fidelity, each vacuum tube may have it's own servo loops as set out and described more fully herein, e.g., to address variations in gain/nonlinearity and operating point of vacuum tube output devices. As an alternate, all tubes on one side of the circuit, e.g., a vacuum tube associated with modules 151, 152, 153, etc., can be tied to a common cathode current sense resistor and only one potentiometer (FIG. 3) or pair of potentiometers (FIG. 7) per side need be employed. This configuration would be cost effective for consumer applications.

By way of illustration, a plurality of tubes could each have a individual cathode resistor for tube balancing/matching. The plurality of tubes could further be tied to a common low value current sense resistor to ground. For a cathode bias pentode stage, such cathode resistors should be selected to establish a proper operating point. Further, in a pentode configuration, having a magnetometer in the output transformer may provide beneficial results because of screen currents and the magnetometer's ability to resolve actual flux levels within the core as the current through the cathode resistors will not be a perfect reflection of what is going on in the transformer, even in ultralinear operation.

Various aspects of the present invention are illustrated herein with reference to the utilization of pentode or triode vacuum tubes as the output devices. However, in practice, the various features set out more fully herein may be implemented with a vast array of different output devices. As described more fully herein, a user has control over the harmonic richness of the amplified signal. Moreover, if a specific implementation include sufficient amplifier stages, a system can be configured that will operate in an asymmetrical mode.

In composite mode, the harmonic signature of the output will be a composite of the signature of the stages. For example, in FIG. 1, six amplifier stages are illustrated. Each stage 141, 142, 143, 151, 152 and 153 may be individually adjusted, e.g., in a manner analogous to that described with reference to FIGS. 2-6. This can provide a very pleasing sound due the subjective nature of listening and the configurable nature of the amplifier to vary the harmonic content.

According to aspects of the present invention, if the input signal to active device functioning as a voltage controlled current source is an audio frequency signal, by altering the magnitude of this signal, the amplifier may be made to exhibit substantially alterable harmonic output properties. In this mode, the amplifier may generate an output harmonic format from substantially similar to that of a single-ended amplifier to that substantially similar to that of a push-pull type amplifier. This active device, when operated as a voltage controlled current source and driven with alternating input signal provides substantial power gain, resulting in an push-pull amplifier that exhibits the harmonic format typical of that to a single-ended amplifier, but output power substantially similar to that of a traditional push-pull amplifier.

Previous current source implementations are very dependent on the intrinsic properties of the output device for proper operation. However, aspects of the present invention configure the output device as a near perfect current source even while substantial AC voltage components are present, e.g., at the plate of an vacuum tube implemented active device, permitting the amplifier to excel in hi fidelity applications. Remarkable transparency is revealed when the AC servo is active.

According to further aspects of the present invention, an auto bias adjustment system is provided for the output devices of an amplifier, which is particularly well suited for use with tube amplifier topologies. The auto bias adjustment is incorporated through a bias generator that implements a DC Servo. As the tubes operate, due to various factors such as age, temperature, line voltage, and loading, the bias of the output tubes may shift. However, an amplifier that employs a DC servo as described more fully herein, maintains bias stability, greatly improves reliability and extends the life of the output tubes. Moreover, a user bias measurement and adjustment feature is not needed, which frees the amplifier from the possible damage caused by improper user adjustment, thus further improving reliability.

Although pentode and tetrode amps operating in class A typically do not suffer from secondary rectification loadline shifts, it is possible to have significant loadline shift when the output stage is configured to suppress odd order harmonics (e.g., as the potentiometer 202B and or 202C is adjusted by a user. In this case, having the magnetometer as a control input to a bias generator 184 is useful if the amp is to be operated under fixed grid bias. With cathode bias, the utilization of a magnetometer is not as important but will still derive relatively higher fidelity than without the use of the magnetometer.

Various aspects of the present invention provide different schemes for establishing operating bias point. In an amplifier that operates with a triode output stage, secondary rectification may result in a load line shift. However, the illustrative bias tracking networks illustrated herein, provide for compensation of such shifts.

As noted in greater detail herein, according to aspects of the present invention, an AC input signal is rectified and introduced to a summing amplifier that uses this as one of its inputs for calculating bias point. A fixed reference is also provided to establish the quiescent bias. This reference is typically selected according to the desired output device duty cycle. For example, in a triode amplifier operating in Class A mode, meaning the output tube is always conducting, a bias point and corresponding reference voltage is selected to keep plate current flowing during 100% of the duty cycle. In a Class AB amplifier, less than 100% duty cycle can be achieved by lowering the quiescent idle current by means of adjusting the reference voltage used for bias point calculation. With careful selection of the attack and decay properties of the AC signal rectification stage, e.g., via selection of resistor 231 and capacitor 232 of FIG. 3, etc., an amplifier may be operated in Class A mode with lower than typical steady state idle current. This improves tube longevity while still maintaining fidelity.

An approach to measure and adjust the quiescent magnetic level within the output transformer provides for improved performance in single-ended mode. Moreover, depending on the harmonic format of the output signal, this measurement and subsequent resolution can be of advantage in other operating modes. For instance, high gain guitar signals are often far less than symmetrical. Thus the output transformer of such push-pull output stages are often loaded with asymmetrical currents. Accordingly, subsequent negative magnetic consequences can result. Therefore it may be of interest to resolve quiescent magnetic currents at all times, depending upon the particular implementation.

Moreover, even in composite mode, magnetic correction may be useful. According to various aspects of the present invention, magnetic levels in an output transformer can be monitored and/or adjusted, as described more fully herein. Thus, various aspects of the present invention achieve symmetrical current draw of an amplifier under all operating conditions, which results in ideal magnetic neutrality within the output transformer when configured to generate single-ended type harmonic output as described more fully herein.

The control grid capacitance of a triode, tetrode or pentode can limit bandwidth of a non-global feedback amplifier if insufficient driving current is available. However, driver circuits described more fully herein, provide sufficient current to overcome grid capacitance induced distortion and roll off without the need for global feedback around the output stage. In a musical instrument amplifier, such as for electric guitar, bass guitar and keyboard, the ability to achieve both high bandwidth without global feedback and an output signal retaining distortion properties intrinsic the output tube(s) can be quite advantageous for desired harmonic and tonal effects. Further, depending upon the specific selection of the active devices, the driver circuits 178 described more fully herein, can deliver a very low impedance voltage source to the control input of the selected output device. The absence of grid coupling capacitors for vacuum tube stages further improves high frequency performance.

Another distinguishing feature of the utilization of the triode with the circuit is the unique frequency characteristics that change dynamically with level. In this regard, the frequency response of the triode can be characterized by slew rate limiting. A triode may have a gain of two. As such, the triode is not necessarily providing a large amount of amplification. Rather, the triode is providing harmonic components to the signal content. As such, the driver circuit may be required to supply an input that is as high as 200 volts or more. An illustrative example, a very large signal may result in a relatively narrow bandwidth. For example, on the order of 5 kHz. However, a small signal, such as may be derived from light finger pressure on the guitar string will generate a relatively lower amplitude signal. Due to slew rate limiting, they lower amplitude signal legs of a relatively wide bandwidth for example on the order of 30 kHz to 100 kHz. As such, low-level signals realize a wide bandwidth, where as large signal swings will exhibit a relatively narrow bandwidth providing natural frequency control for loud transient signals.

Power Supply Filter Arrangement

Figure 8:
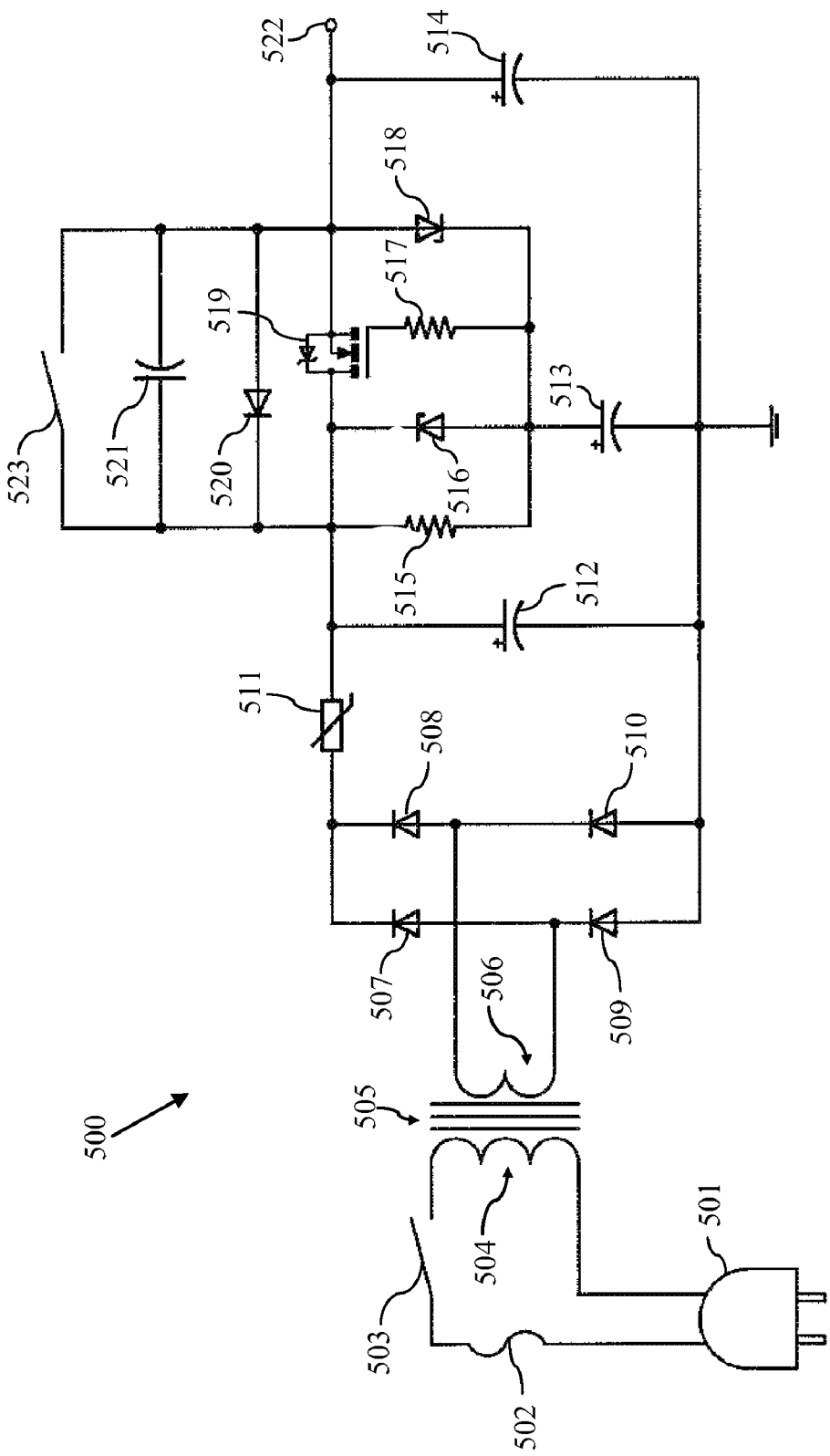
FIG. 8 is schematic diagram of an anode power supply according to various aspects of the present invention.

With reference to FIG. 8, a power supply filter 500 is illustrated according to various aspects of the present invention. In general, the solid state power supply filter 500 provides a module for powering the active device, which includes an active power device and filter circuitry that provides substantial AC hum reduction during operation of the active device as a current source, and simultaneously provides output voltage load regulation attributes that mimic traditional vacuum tube rectifier circuits. In this regard, the power supply filter 500 is not regulated to a fixed DC voltage, but rather, acts as a filter.

The power supply filter 500 includes a connection to an AC wall voltage, e.g., 120Vrms 60 Hz, as provided through a power cable and plug 501. The power cable 501 includes a first conductor and a second conductor. A fuse 502 and a switch 503 are wired in series with the first conductor, and the first and second conductor are wired in parallel across primary windings 504 of a power transformer 505.

When the power cable 501 is plugged into an appropriate outlet, and when the switch 503 is closed, secondary winding 506 of the power transformer 505 provides AC voltage to a rectifier, schematically illustrated as solid state rectifier diodes 507, 508, 509 and 510, which provide full wave rectification of the incoming AC voltage. The illustrated power supply provides a single polarity rail supply. In this regard, the junction of the diodes 509, 510 are tied to ground, and the junction of the diodes 507, 508 defines a positive, unregulated and rectified voltage.

A thermistor 511 is connected in series between the rectifier and a first terminal of an active power device. For instance, as illustrated, the thermistor 511 is connected between the junction of the diodes 507 and 508, and the drain of a MOSFET 519, e.g., an N-channel MOSFET as schematically illustrated. The thermistor 511 limits startup surge current to a filter capacitor 512, which is connected between the drain of the MOSFET 519 and ground.

A filter network is formed by capacitor 513 and resistor 515 to provide a highly filtered low ripple reference voltage. The resistor 515 electrically connects to the drain of the MOSFET 519 and forms a series connection to the capacitor 513, which further couples to ground. A zener diode 516 in parallel with resistor 515 may also be utilized to provide for quick charging of the capacitor 513 during startup. The zener diode 516 should be selected to have a voltage drop greater than the peak AC ripple voltage across the filter capacitor 512.

The rectified AC voltage thus passes through the thermistor 511 and through the filter network, then through a resistor 517 that couples to the junction of the capacitor 513 and resistor 515, to the control terminal of the MOSFET 519. The resistor 517 reduces the likelihood of high frequency power supply oscillation. A zener diode 518 is connected between a second terminal, e.g., the source of the MOSFET 519 as illustrated, and the junction of the capacitor 513, resistor 515, diode 516, and resistor 517, and is provided to protect the control input of MOSFET 519 from transient voltage spikes. Capacitor 514 is connected from the source of the MOSFET 519 to ground, and is the final filter element aiding in smoothing AC ripple voltage.

A diode 520 provided across the source and drain of the MOSFET 519 provides protection from reverse voltage during power down. A capacitor 421, also provided across the source and drain of the MOSFET 519, may be necessary to prevent oscillation. The value of the capacitor 521 should be selected to be as low as practical.

Output voltage from the source of the MOSFET 519, as filtered by the capacitor 514, is supplied to the rest of the amplifier by terminal 522.

A switch 523, also provided across the source and drain of the MOSFET 519, permits the user to selectively enable or disable the active power supply filter. As may be the case when the power supply is employed for use in a push-pull mode amplifier, disabling the active filter will not necessarily increase audible hum. The slightly increased output voltage and low impedance of the disabled active filter will contribute to an overall different distortion product of the amplifier output signal.

Audio Frequency amplifier power supply requirements vary with the intended application. In a traditional and properly operating push-pull amplifier, power supply ripple does not significantly introduce audible hum within the output signal. Transformer coupled single-ended audio frequency amplifiers are not afforded such good favor. Because of the inherent asymmetry within the output transformer, any ripple or power supply induced noise will be impressed on the output signal. However, according to various aspects of the present invention, an audio frequency amplifier of the single-ended type is provided, that incorporates power supply noise and ripple reduction that reduces power supply induced noise in the output of the amplifier.

Audio frequency amplifiers intended for instrument amplification, such as those for guitar and bass may have additional requirements imposed due to the subjective nature of music creation. Before the advent of the solid state rectifier, all audio and instrument amplifiers employed vacuum tube type rectifiers within their power supply circuitry. The vacuum tube rectifier was generally coupled to a capacitor and or choke network to supply steady DC voltage to the entire amplifier. This power supply exhibited an inherent performance quite different than modern solid state rectifier/capacitor supplies.

Whereas modern solid state power supplies intended for use in audio frequency amplifiers excel at delivering fairly load invariable voltage, their vacuum tube rectifier counterparts do not. Vacuum tube type rectifiers exhibit a lesser degree of regulation, increased voltage drop and slower response to changing current demands. In an instrument amplifier, this slow response provides a 'spongy' feel many musicians find quite desirable. Many classic recording are quite difficult to faithfully reproduce without an instrument amplifier employing a vacuum rectifier power supply.

Vacuum rectifier supplies also find favor in modern rock voiced instrument amplifiers due to their pleasing tone compression qualities. At other times, an amplifier plate power supply that provides fairly constant load invariable voltage may be advantageous to the musician. As music and musicians are, all things are subjective.

However, according to various aspects of the present invention, an audio frequency amplifier power supply is provided, e.g., a solid state power supply, that exhibits load variable output voltage and minimal power supply hum and ripple, thus providing reduced noise in an audio frequency amplifier.

A variable impedance power supply is employed that maintains a low mains induced AC ripple supply voltage to the amplifier output stage. A solid-state rectifier/capacitor network provides the initial DC voltage to the active series-pass device. The control input of the series pass device is connected to a filter network that substantially prevents mains induced ripple from being present at its input terminal. Interaction of the pass devices internal impedance and voltage drop working in combination with the pass device control input circuitry creates a variable impedance power source exhibiting a time variable and load dependant supply voltage drop.

The supply noise filtering and variable voltage drop may be beneficial depending on the operation mode of the amplifier and the signal being amplified. An example is single-ended mode guitar amplification. Single-ended amplifiers are very susceptible to power supply noise and will typically pass power supply noise with the desired amplified signal to the speaker. The sound of power supply hum and noise is almost always perceived as quite objectionable. However, according to aspects of the present invention, the audible hum component is near eliminated. The variable supply voltage drop associated with this power supply provides some degree of output stage signal compression and distortion. In a guitar amplifier application this will increase the low order harmonic content of the output signal in an acoustically pleasing way.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

Having thus described various embodiments of the present invention in detail herein, it will be apparent that modifications and variations are possible without departing from the scope of the embodiments of the present invention defined in the claims.

What is claimed is:

1. An amplifier having an alterable harmonic format, comprising:
   at least two amplifier modules forming an audio amplifier stage, wherein a first one of amplifier modules comprises:
      an active device;
      a servo that monitors an output signal that is derived from an output from the active device; and
      a mode control that controls at least one of: an audio signal path to an input of the active device, and a feedback path from the servo to the input of the active device, the mode control having at least one setting that operates the active device as a servo loop controlled, current source.

2. The amplifier according to claim 1, wherein the active device comprises a transformer coupled vacuum tube.

3. The amplifier according to claim 2, wherein the vacuum tube comprises a triode.

4. The amplifier according to claim 3, wherein the vacuum tube triode comprises a select one of: 6C33C, 6C33C-B and 6C33C-BP.

5. The amplifier according to claim 1, wherein:
   the mode control further comprises at least one additional setting, such that the mode control enables the audio signal path to couple an audio signal to the input of the active device and effectively decouples a feedback loop from the servo to the input of the active device such that the active device functions as an audio amplification module and the audio amplifier stage has a harmonic format corresponding to a push-pull mode.

6. The amplifier according to claim 1, wherein:
   an input to the servo comprises a fixed reference; and
   the mode control comprises at least one setting, such that:
   in at least one setting, the mode control effectively decouples the audio signal path from the input of the active device and closes a feedback loop from the servo to the input of the active device, such that the servo operates the active device as a servo loop controlled, current source and the audio amplifier stage has a harmonic format corresponding to a single-ended mode.

7. The amplifier according to claim 1, wherein:
   the mode control comprises a user-adjustable control that allows the user to select at least between:
   a mode control setting that enables the audio signal path to couple an audio signal to the input of the active device and effectively decouples a feedback loop from the servo to the input of the active device such that the active device functions as an audio amplification module and the audio amplifier stage has a harmonic format corresponding to a push-pull mode; and
   a mode control setting where an input to the servo comprises a fixed reference and the mode control effectively decouples the audio signal path from the input of the active device and closes a feedback loop from the servo to the input of the active device, such that the servo operates the active device as a servo loop controlled, current source and the audio amplifier stage has a harmonic format corresponding to a single-ended mode.

8. The amplifier according to claim 1, wherein:
   the mode control comprises at least one setting such that:
   the audio signal path couples an audio signal to an input of the servo through the mode control;
   the mode control affects the audio signal coupled to the input of the servo;
   the active device operates as a servo controlled current source with a variable reference; and
   the audio amplifier stage has a harmonic format established by the relative amount of the audio signal coupled to the input of the servo.

9. The amplifier according to claim 8, wherein the mode control comprises a user adjustable control that allows a user to select a plurality of harmonic formats based upon an adjustment of the user adjustable control.

10. The amplifier according to claim 1, wherein, in at least one setting, the mode control comprises:
   circuitry that scales at least one of: an audio frequency signal and a feedback signal from the feedback path of the servo, and mixes the two signals together; wherein:
   the mixed signal is coupled to the input of the active device;
   the active device operates as a servo controlled current source; and the audio amplifier stage has a harmonic format established by the relative balance of the audio frequency signal and the servo feedback signal fed to the input of the active device.

11. The amplifier according to claim 10, wherein the circuitry comprises a user adjustable control that affects the blend of the audio frequency signal with the feedback signal from the servo, such that a user can select a plurality of harmonic formats based upon an adjustment of the user adjustable control.

12. The amplifier according to claim 1, wherein:
the audio frequency path couples an audio frequency signal to the input of the active device; and
the mode control comprises a circuit that controls the amount of a feedback signal from the feedback path of the servo that is coupled to the input of the active device such that:
the active device operates as a servo controlled current source; and
the audio amplifier stage has a harmonic format established by the relative balance of the audio frequency signal and the servo feedback signal fed to the input of the active device.

13. The amplifier according to claim 1, wherein:
a first audio signal path couples to an input of the servo;
a second audio signal path couples to the input of the active device;
the mode control further comprises:
 first circuitry that scales an audio frequency signal that is coupled to an input of the servo on the first audio signal path;
 second circuitry that scales an audio frequency signal on the second audio signal path; and
 third circuitry that scales a feedback signal on the feedback path from the servo;
the scaled audio frequency signal and the scaled feedback signal are coupled to the input of the active device;
the active device operates as a servo controlled current source; and
the audio amplifier stage has a harmonic format established by the relative balance of the audio frequency signal and the servo feedback signal fed to the input of the active device.

14. The amplifier according to claim 1, wherein:
the active device comprises a triode vacuum tube; further comprising:
a driver circuit that drives the active device so as to provide at least one of: high current drive, low distortion and low output impedance.

15. The amplifier according to claim 14, wherein:
the driver circuit comprises a solid state driver circuit having an amplifier that drives at least one transistor device, wherein the driver circuit employs local feedback.

16. The amplifier according to claim 1, further comprising:
a solid state power supply filter module for powering the active device, the power supply filter having an active power device and filter circuitry that provides substantial AC hum reduction during operation of the active device as a current source, and simultaneously provides output voltage load regulation attributes that mimic traditional vacuum tube rectifier circuits.

17. The amplifier according to claim 1, further comprising a variable bias generator that utilizes a servo loop around the active device to automatically adjust a direct current bias signal for the active device.

18. The amplifier according to claim 17, wherein:
the variable bias generator automatically adjusts a direct current bias signal based upon at least one of: a reference voltage level and an envelope of a corresponding input audio signal.

19. The amplifier according to claim 17, further comprising:
an output transformer coupled to the output of the active device, wherein:
the variable bias generator automatically adjusts the direct current bias signal based at least upon input from a magnetometer that measures the flux in the output transformer.

\* \* \* \* \*